US009883605B2

United States Patent
Donachy et al.

(10) Patent No.: US 9,883,605 B2
(45) Date of Patent: Jan. 30, 2018

(54) RACK ATTIC DEVICE COUPLING SYSTEM

(71) Applicant: Dell Products L.P., Round Rock, TX (US)

(72) Inventors: John Charles Donachy, Austin, TX (US); Craig Warren Phelps, Austin, TX (US); Amelia Cosgrove Thomas, Austin, TX (US); Peter Kaltenbach, Austin, TX (US); Orin M. Ozias, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 239 days.

(21) Appl. No.: 14/699,735

(22) Filed: Apr. 29, 2015

(65) Prior Publication Data

US 2016/0324029 A1    Nov. 3, 2016

(51) Int. Cl.
*H05K 7/16*    (2006.01)
*H05K 7/14*    (2006.01)

(52) U.S. Cl.
CPC ................................ *H05K 7/1488* (2013.01)

(58) Field of Classification Search
CPC .. H05K 7/1488; H05K 7/1489; H05K 7/1491; H05K 7/1492; H05K 7/1494; H05K 7/1495; G06F 1/183; G06F 1/187
USPC ......... 211/26; 312/223.1, 223.2; 361/679.56, 361/724–727
See application file for complete search history.

(56) References Cited

U.S. PATENT DOCUMENTS

| | | | |
|---|---|---|---|
| 6,499,609 B2 | 12/2002 | Patricke et al. | |
| 6,711,009 B2* | 3/2004 | Lee | G06F 1/181 248/551 |
| 6,769,540 B2* | 8/2004 | Hsieh | G11B 33/128 206/307 |
| 6,826,055 B2 | 11/2004 | Mease et al. | |
| 8,120,922 B2* | 2/2012 | Randall | G11B 33/126 361/725 |
| 8,363,414 B2* | 1/2013 | Peng | G06F 1/181 312/223.1 |
| 9,265,173 B1* | 2/2016 | Jhang | G06F 1/187 |
| 2005/0117310 A1* | 6/2005 | Miyamoto | G11B 33/144 361/724 |

(Continued)

OTHER PUBLICATIONS

"Rubbermaid Large Pull-Out Drawer," Rubbermaid Large Pull-Out Drawer: Kitchen & Dining: Walmart.com, pp. 1-2, http://www.ndc.walmart.com/ip/Rubbermaid-Large-Pull-Out-Drawer/15779545.

*Primary Examiner* — Joshua Rodden
(74) *Attorney, Agent, or Firm* — Haynes and Boone, LLP

(57) ABSTRACT

A rack system includes a rack base defining a plurality of device slots. A rack wall on the rack base defines a rack volume adjacent a first device slot. A rack volume device coupling system is located in the rack volume and includes a rack volume base positioned in the rack volume. A rack tray is moveably coupled to the rack volume base and configured to move from a first orientation where the rack tray is located in the rack tray housing, to a second orientation where the rack tray extends from the rack volume and into the first device slot. A device is then moved through the first device slot and into the rack tray when the rack tray is in the second orientation. The rack tray is then moved from the second orientation and into the first orientation such that the device is located in the rack volume.

16 Claims, 30 Drawing Sheets

(56) References Cited

U.S. PATENT DOCUMENTS

| | | | |
|---|---|---|---|
| 2005/0185370 A1* | 8/2005 | Chung | G06F 1/181 361/679.56 |
| 2008/0106871 A1* | 5/2008 | James | H04Q 1/023 361/727 |
| 2012/0018237 A1 | 1/2012 | Kovach et al. | |
| 2015/0163946 A1* | 6/2015 | Kyle | H05K 7/1421 312/295 |
| 2015/0257295 A1* | 9/2015 | Lu | H04Q 1/021 312/223.2 |

* cited by examiner

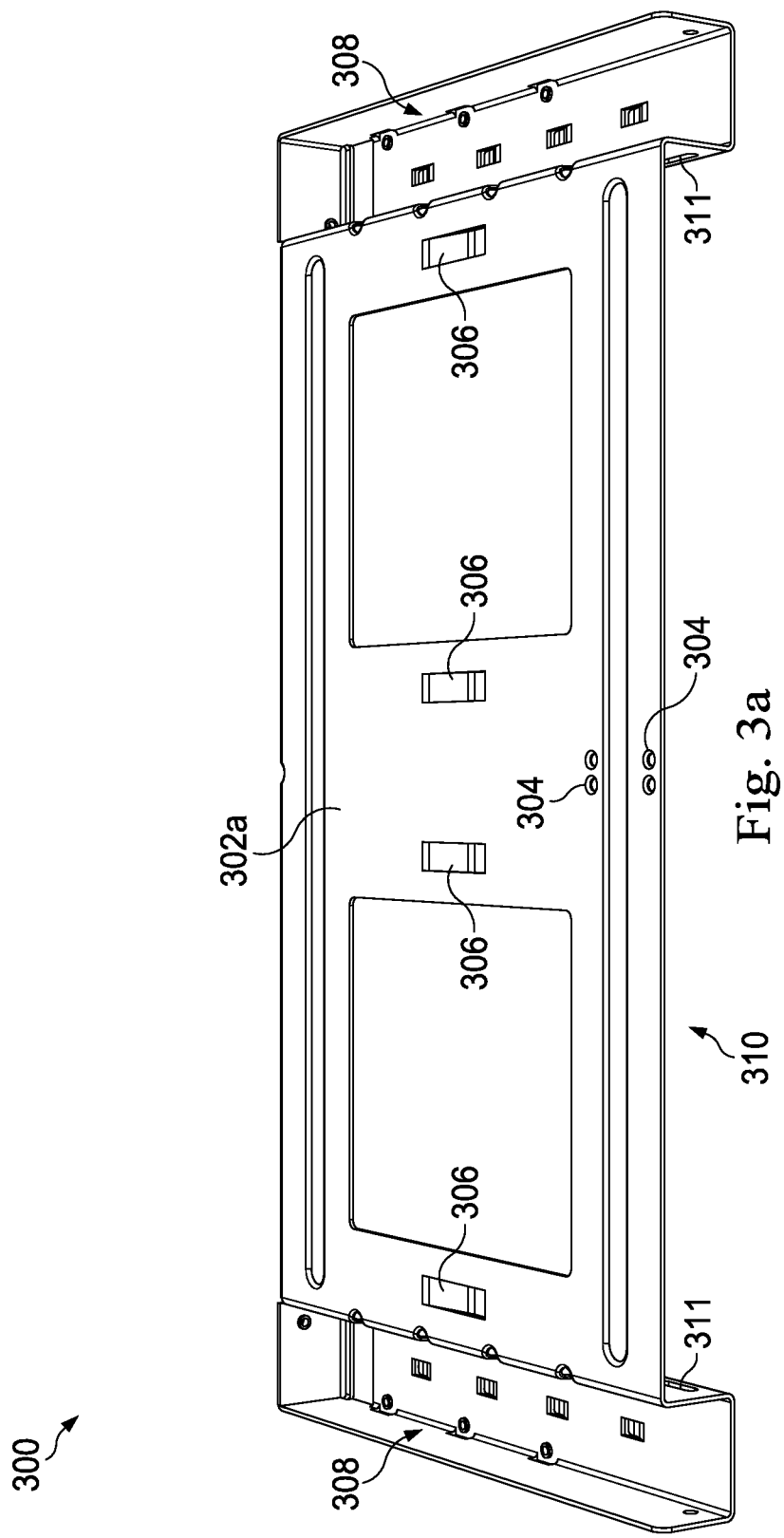

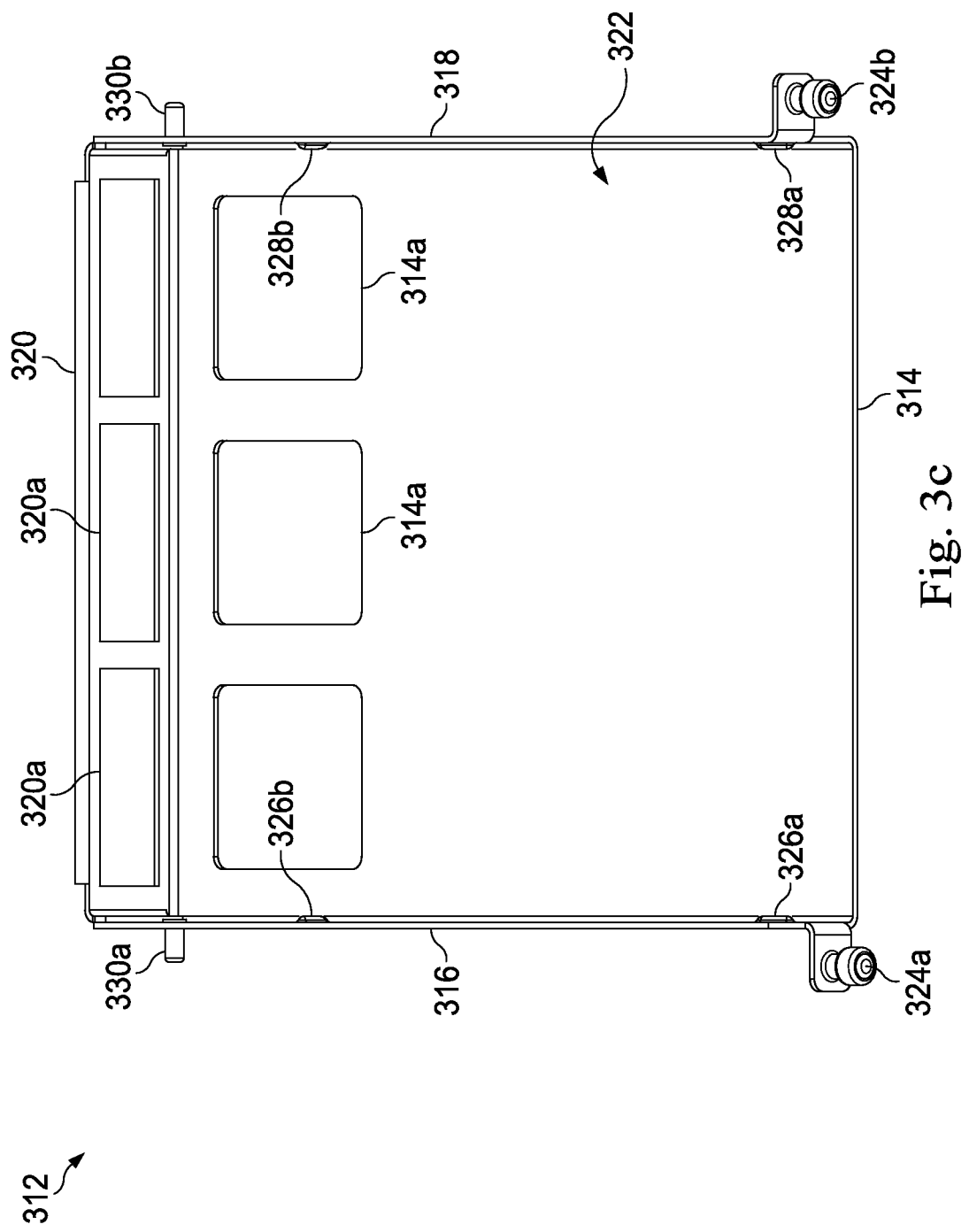

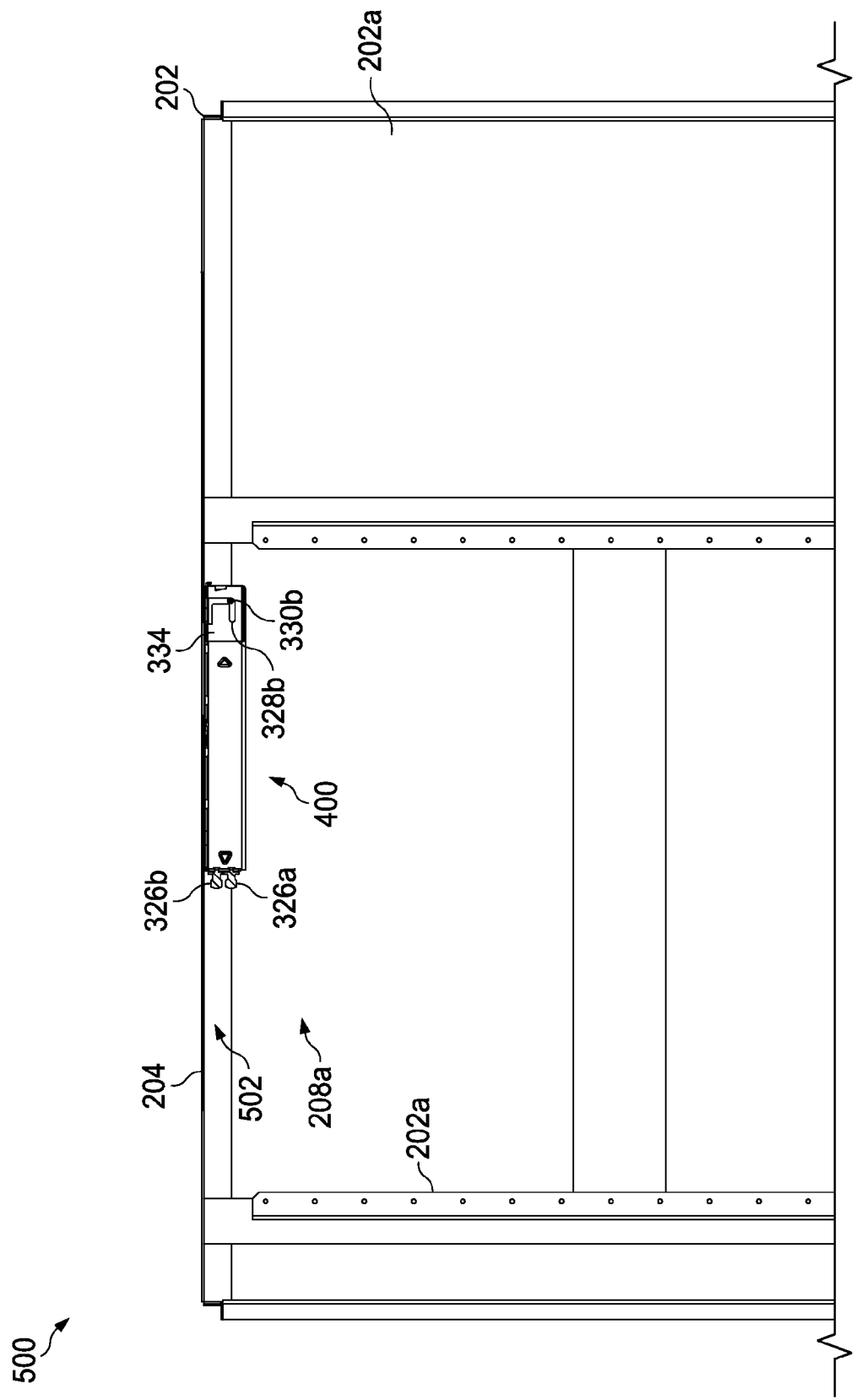

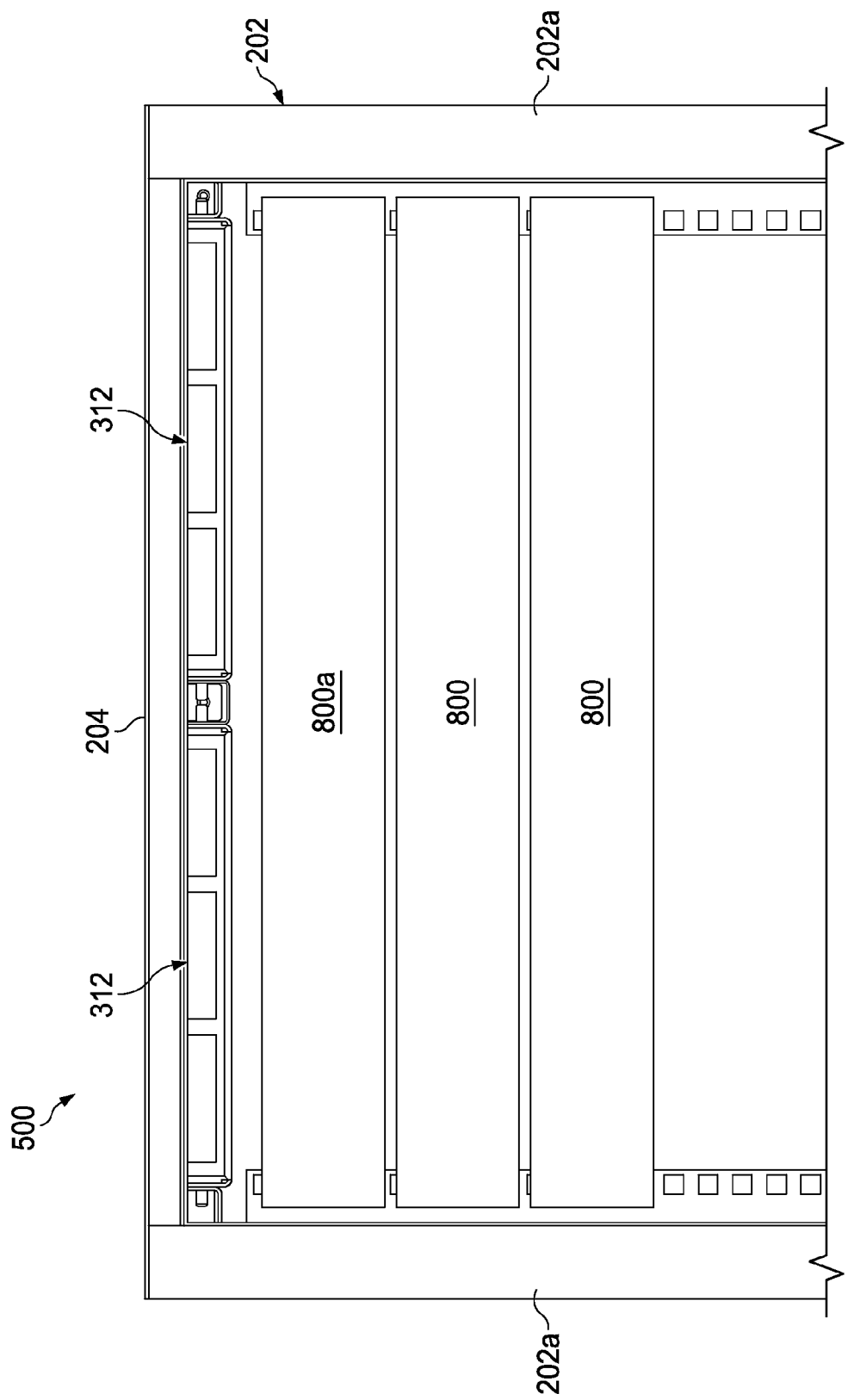

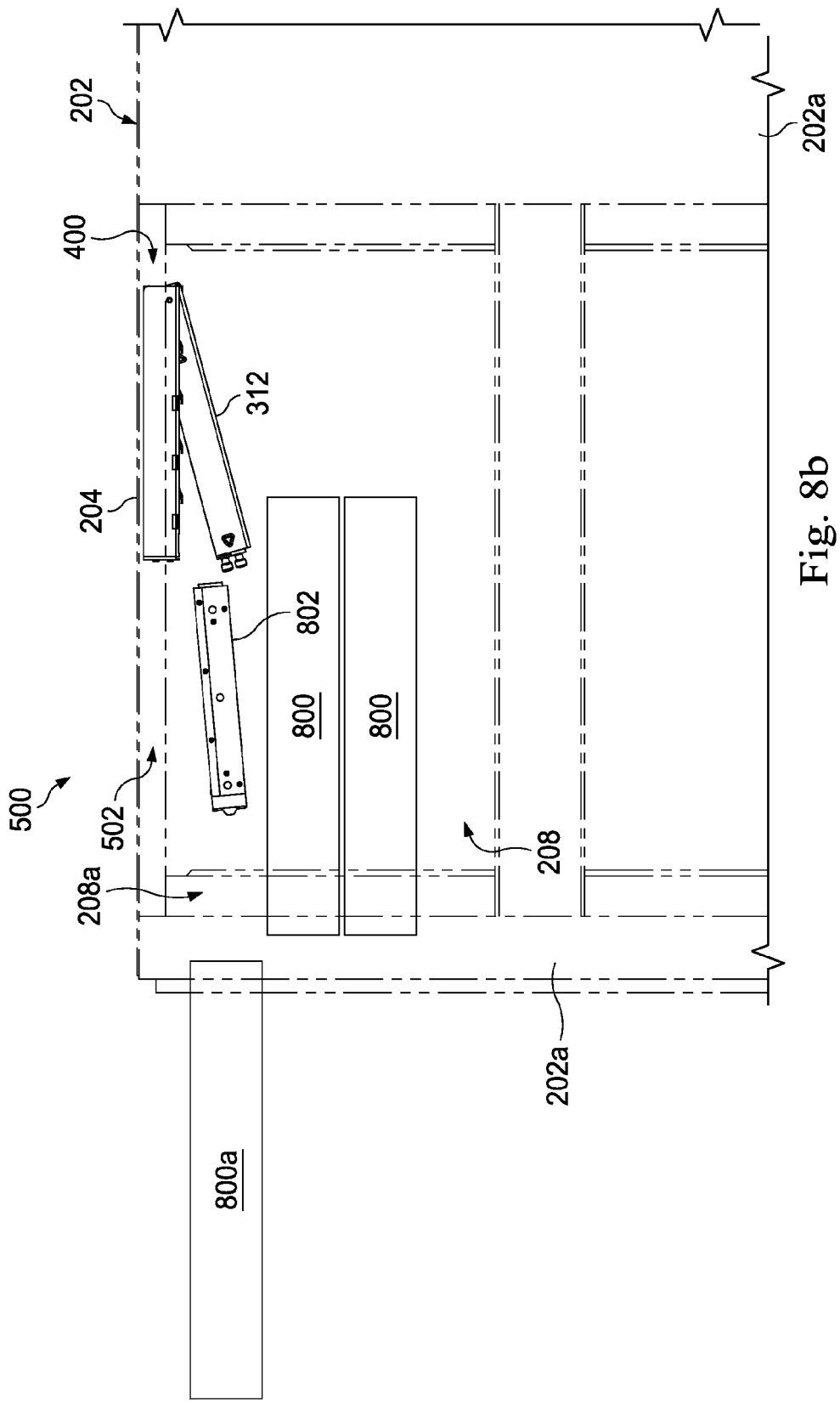

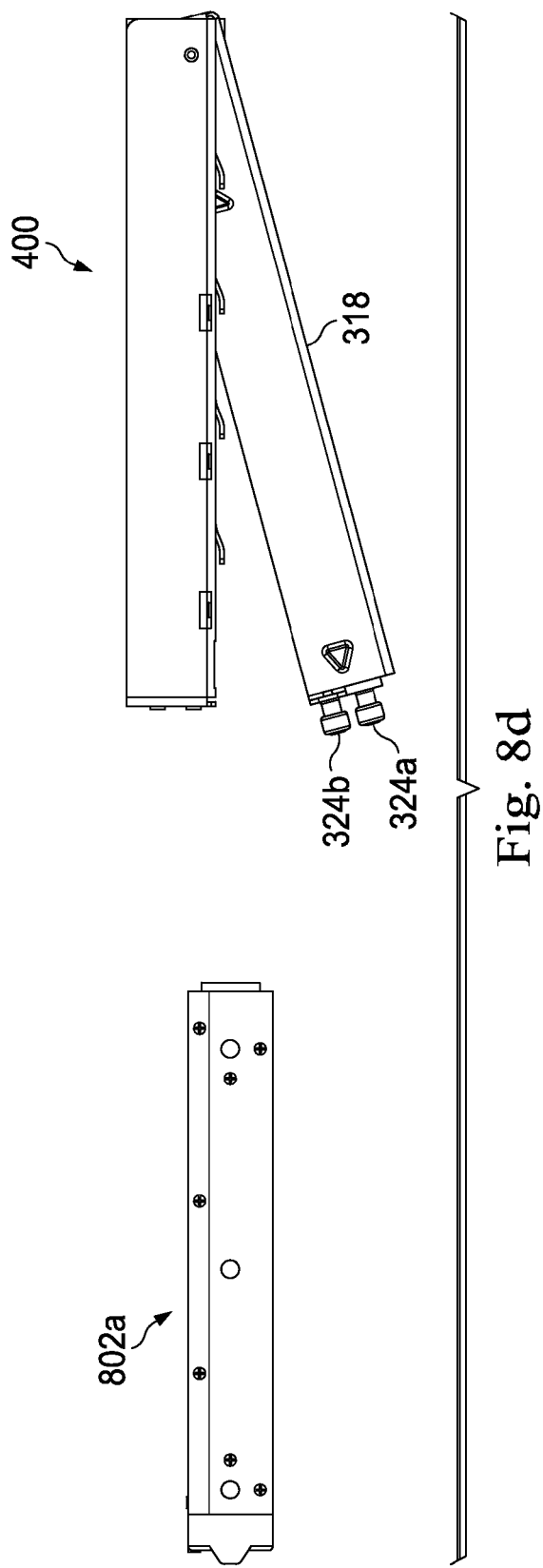

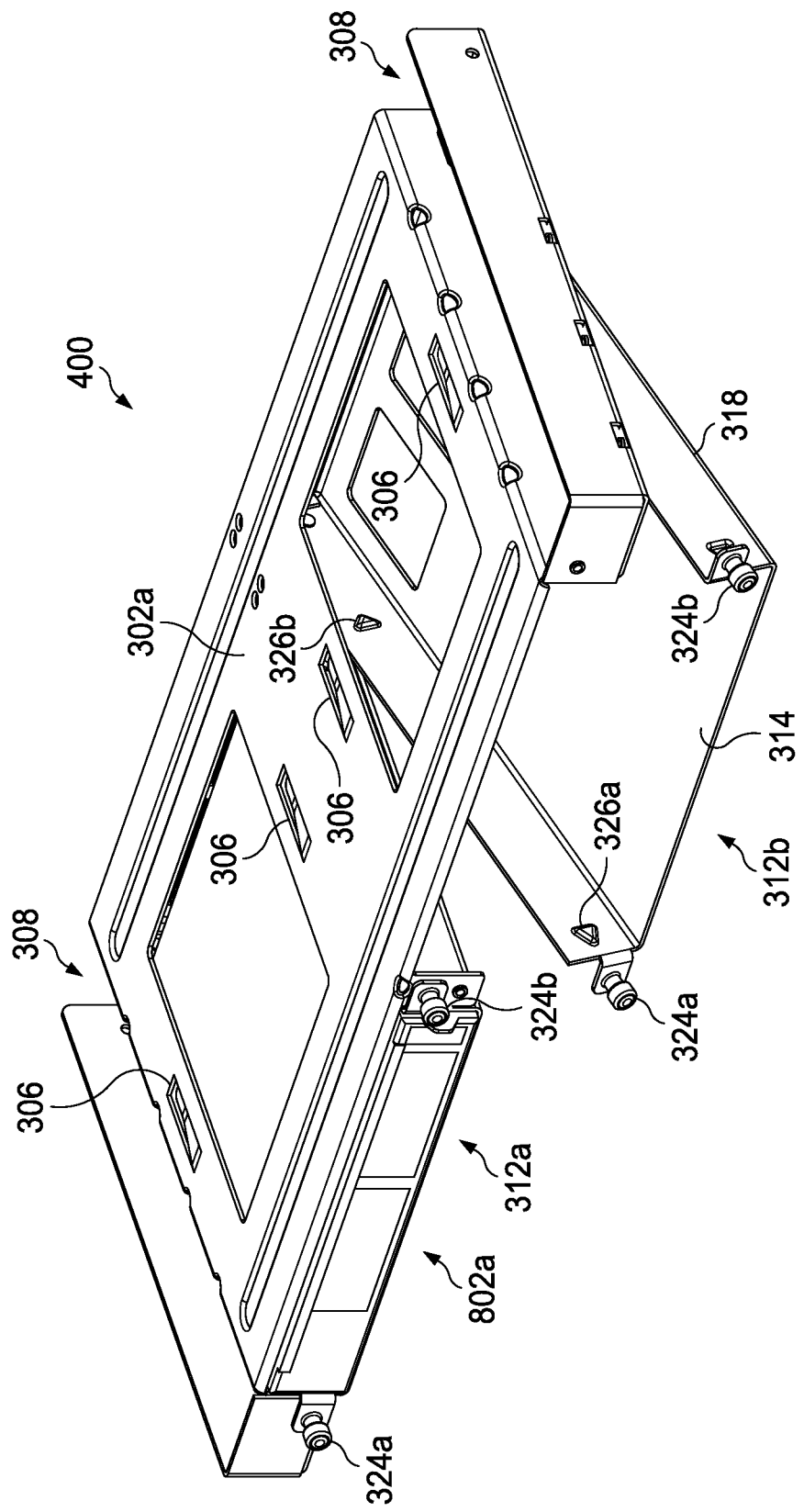

RACK ATTIC DEVICE COUPLING SYSTEM

BACKGROUND

The present disclosure relates generally to information handling systems, and more particularly to a rack attic device coupling system for coupling information handling systems to a rack.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

IHSs such as, for example, networking device, server devices, and storage devices, are sometimes positioned in racks and connected together, as well as connected to other devices that are positioned outside of the rack. For example, a conventional full size rack (e.g., a 42 rack unit (42U) rack) can hold a number of devices that depends on the size of those devices (e.g., 1U devices, 2U devices, etc.) In many cases, it may be desirable to utilize as much space in a rack as possible in order to maximize the number of devices that may be positioned in that rack, and it has been found that there is space available in conventional racks that has not previously been utilized.

Accordingly, it would be desirable to provide a device coupling system that allows for the positioning of devices in previously unutilized spaces in a rack.

SUMMARY

According to one embodiment, a rack volume device coupling system includes a rack volume base that defines a rack tray housing and that is configured to mount to a rack and; and a first rack tray that is configured to moveably couple to the rack volume base, wherein with the rack volume base mounted to the rack such that the rack volume base is positioned in a rack volume defined by the rack, the first rack tray is configured to: move from a first orientation in which the first rack tray is located in the rack tray housing and into a second orientation in which the first rack tray extends from the rack volume and into a first device slot that is defined by the rack; receive and house a first device that is moved through the first device slot and into the first rack tray when the first rack tray is in the second orientation; and move from the second orientation and into the first orientation such that the first device is located in the rack volume.

BRIEF DESCRIPTION OF THE DRAWINGS

FIG. 3a is a top perspective view illustrating an embodiment of a rack attic base.

FIG. 3b is a bottom perspective view illustrating an embodiment of the rack attic base of FIG. 3a.

FIG. 3c is a top perspective view illustrating an embodiment of a rack tray used with the rack attic base of FIGS. 3a and 3b.

FIG. 4b is a bottom exploded perspective view illustrating an embodiment of the rack attic device coupling system of FIG. 4a.

FIG. 5c is a side view illustrating an embodiment of the rack attic device coupling system of FIGS. 4d-4f coupled to the rack of FIG. 2 in the forward-facing orientation.

FIG. 8a is a front view illustrating an embodiment of the rack attic device coupling system of FIGS. 4d-4f positioned in the rack of FIG. 2 with a plurality of devices coupled to the rack.

FIG. 8b is a side view illustrating an embodiment of the rack attic device coupling system, rack, and plurality of devices of FIG. 8a with a device being removed from the rack to couple a device to the rack attic device coupling system.

FIG. 8d is a side view illustrating an embodiment of a device being coupled to the rack attic device coupling system of FIGS. 4d-4f.

FIG. 8e is a perspective view illustrating an embodiment of a device coupled to the rack attic device coupling system of FIGS. 4d-4f.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
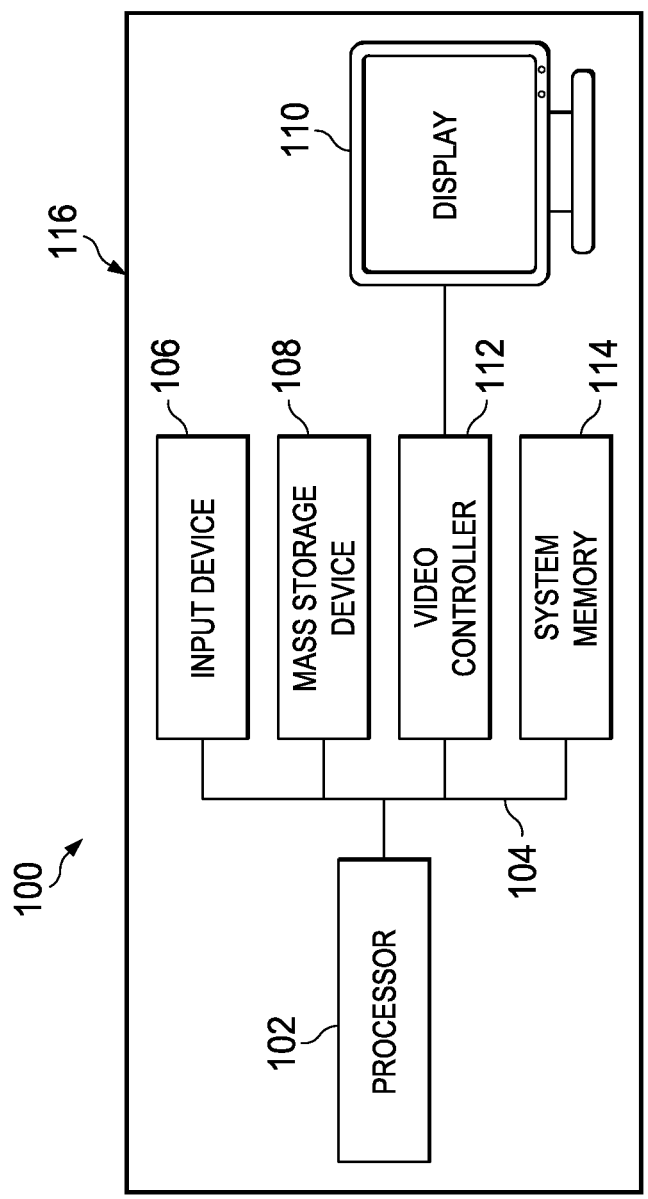
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
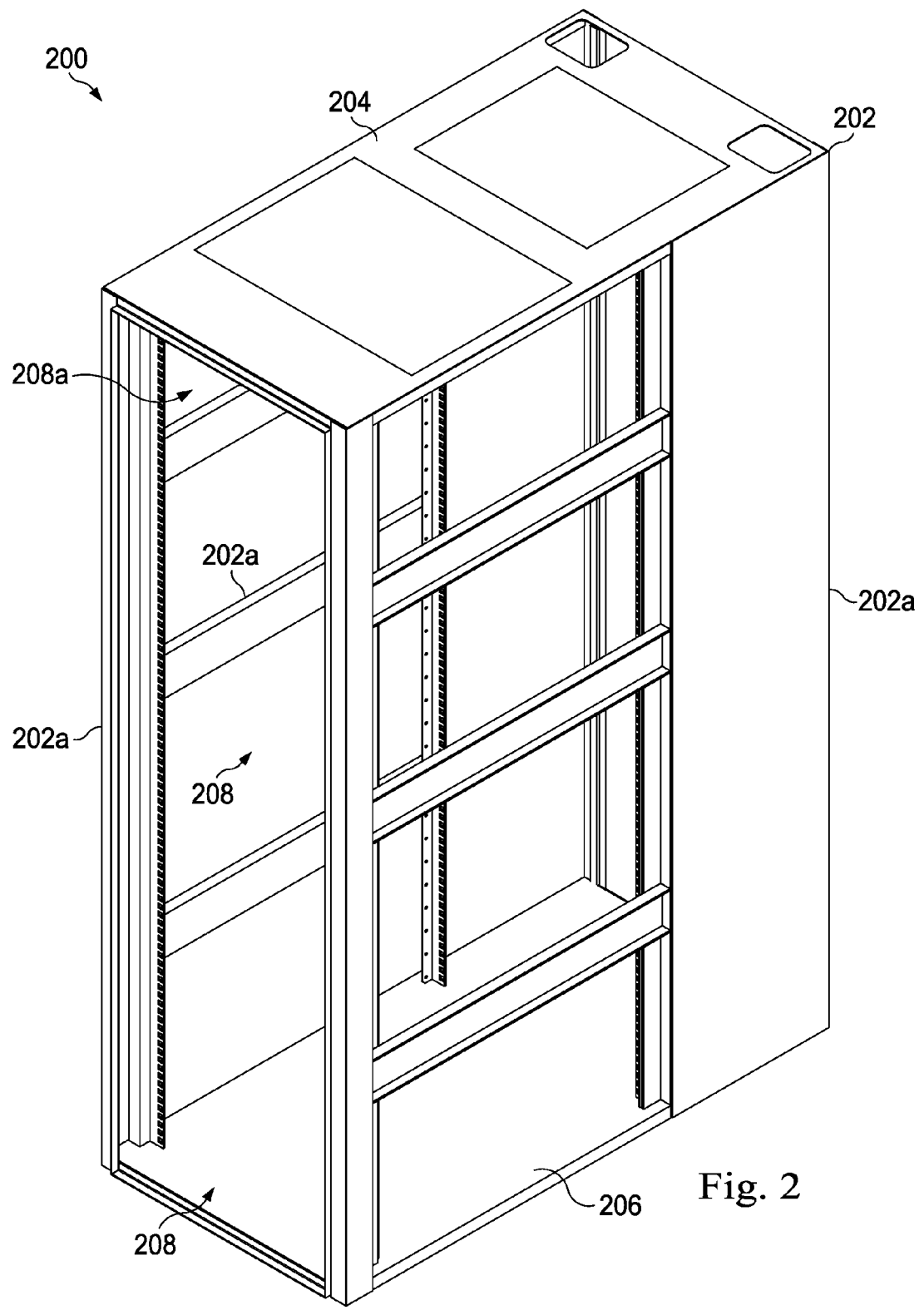
FIG. 2 is a perspective view illustrating an embodiment of a rack.

Referring now to FIG. 2, an embodiment of a rack 200 is illustrated. The rack 200 includes a rack base 202 including a plurality of rack base features 202a that are illustrated as including beams, walls, coupling features, and/or a variety of other rack components known in the art that provide the structure of the rack 200. The rack base features 202a are provided between a rack top wall 204 and a rack bottom wall 206 to provide the rack 200 and define a plurality of a device slots 208 including a first device slot 208a that is located adjacent the rack top wall 204. In the embodiments discussed below, the first device slot 208a is positioned immediately adjacent a rack "attic" that is defined by the rack top wall 204 and that has previously not been utilized in conventional racks for positioning devices in the rack. However, as also discussed below, other rack walls and/or rack features may define rack volumes adjacent device slots defined in different locations on the rack 200 while remaining within the scope of the present disclosure. In the embodiments discussed below, the rack 200 is illustrated and described as a 42U rack that is configured to house devices such as the IHS 100, discussed above with reference to FIG. 1, in the device slots 208. However, one of skill in the art in possession of the present disclosure will recognize that a variety of other types of racks with different features and dimensions will benefit from the present disclosure and fall within its scope.

Figure 3B:
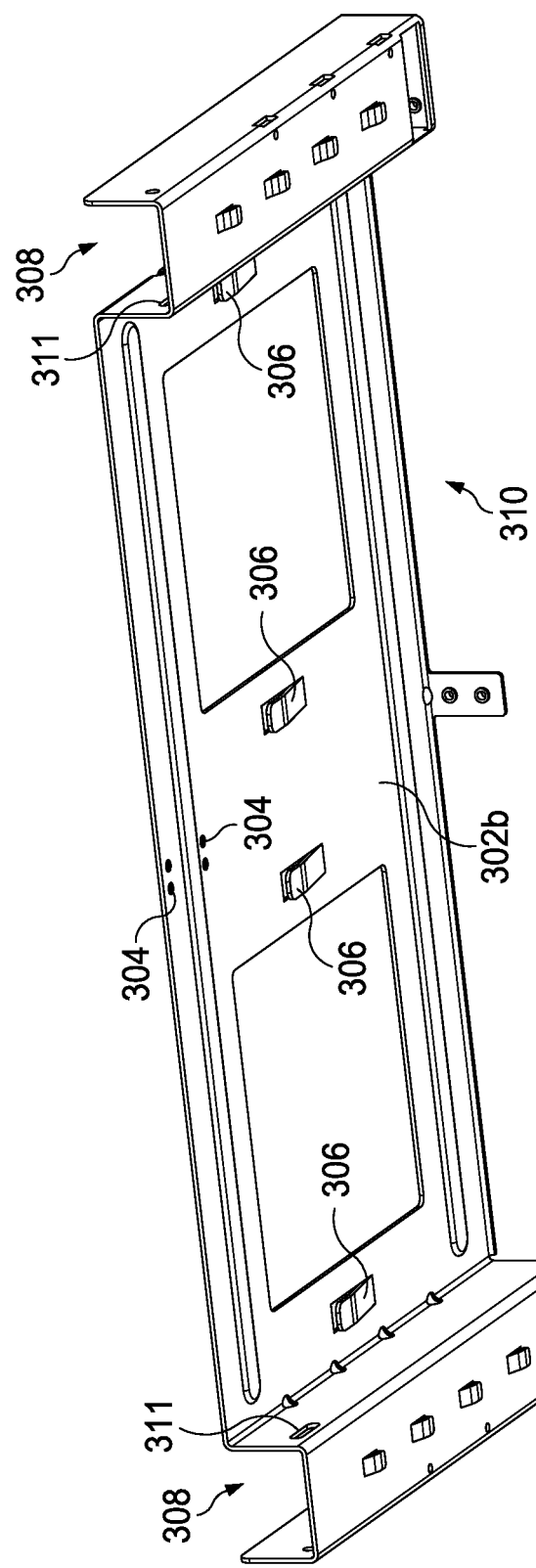

Referring now to FIGS. 3a and 3b, an embodiment of a rack volume base is illustrated. In the embodiments illustrated and described below, the rack volume base is a rack attic base 300 that is part of a rack attic device coupling system that is utilized for positioning devices in a rack attic, discussed above, but one of skill in the art will recognize that different rack volume bases may be utilized in rack volume device coupling systems for coupling devices to different volumes in a rack while remaining within the scope of the present disclosure. The rack attic base 300 includes a top surface 302a and a bottom surface 302b that is located opposite the rack attic base 300 from the top surface 302a. A plurality of tray coupling member apertures 304 are defined by the rack attic base 300 and extend through the rack attic base 300 from the top surface 302a to the bottom surface 302b. A plurality of device engagement features 306 extend from the bottom surface 302b of the rack attic base 300. The rack attic base 300 defines a pair of routing channels 308 on opposite sides of the rack attic base 300, as well as a tray channel 310 between the pair of routing channels 308. A pair of tray coupling slots 311 are defined by the rack attic base 300 on opposite sides of the tray channel 310. While not explicitly called out with reference numbers or in the discussion above, the rack attic base 300 includes several features utilized in coupling the rack attic base 300 to the rack 200 and, as discussed in further detail below, and one of skill in the art in possession of the present disclosure will recognize that those and/or additional/different features may be provided for coupling a rack attic base and/or rack volume base to different racks utilizing the teachings of the present disclosure.

Figure 3D:
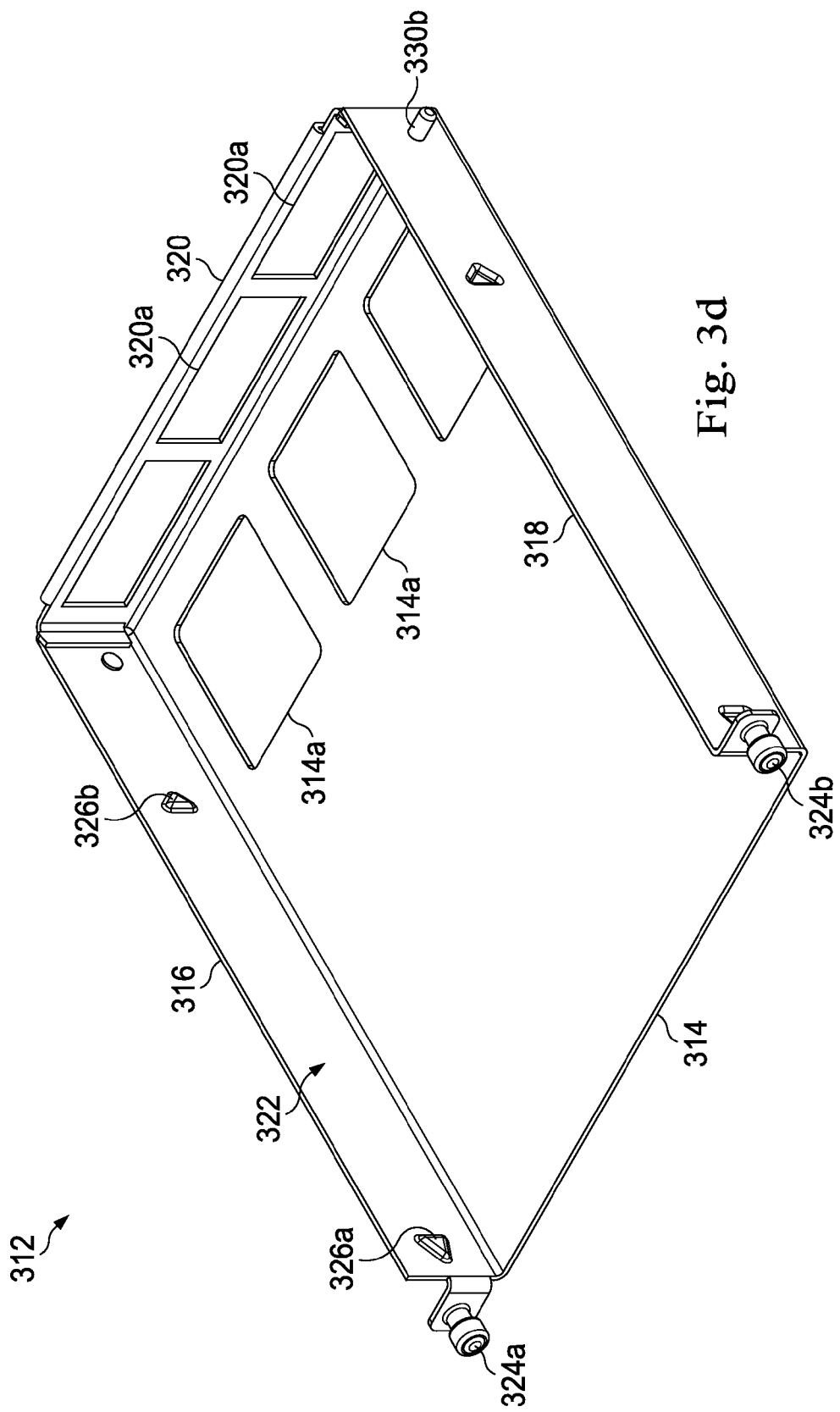
FIG. 3d is a top perspective view illustrating an embodiment of the rack tray of FIG. 3c.

Referring now to FIGS. 3c and 3d, an embodiment of a rack tray 312 is illustrated. The rack tray 312 includes a base 314, a pair of side walls 316 and 318 extending from opposite edges of the base 314, and a rear wall 320 extending between the base 314 and the side walls 316 and 318. The base 314, side walls 316 and 318, and the rear wall 320 define a tray housing 322. A securing member 324a extends from an edge of the side wall 316 and opposite the side wall 316 from the rear wall 320, and a securing member 324b extends from an edge of the side wall 318 and opposite the side wall 316 from the rear wall 320. A pair of device engagement features 326a and 326b are located on the side wall 316 in a spaced-apart orientation and extend from the side wall 316 and into the tray housing 322. A pair of device engagement features 328a and 328b are located on the side wall 318 in a spaced-apart orientation and extend from the side wall 318 and into the tray housing 322. A moveable coupling 330a extends from the side wall 316 on an opposite side of the side wall 316 from the tray housing 322, and a moveable coupling 330b extends from the side wall 318 on an opposite side of the side wall 318 from the tray housing 322. The base 314 defines a plurality of routing channels 314a adjacent the rear wall 320, and the rear wall 320 defines a plurality of routing channels 320a across its length.

Figure 3E:
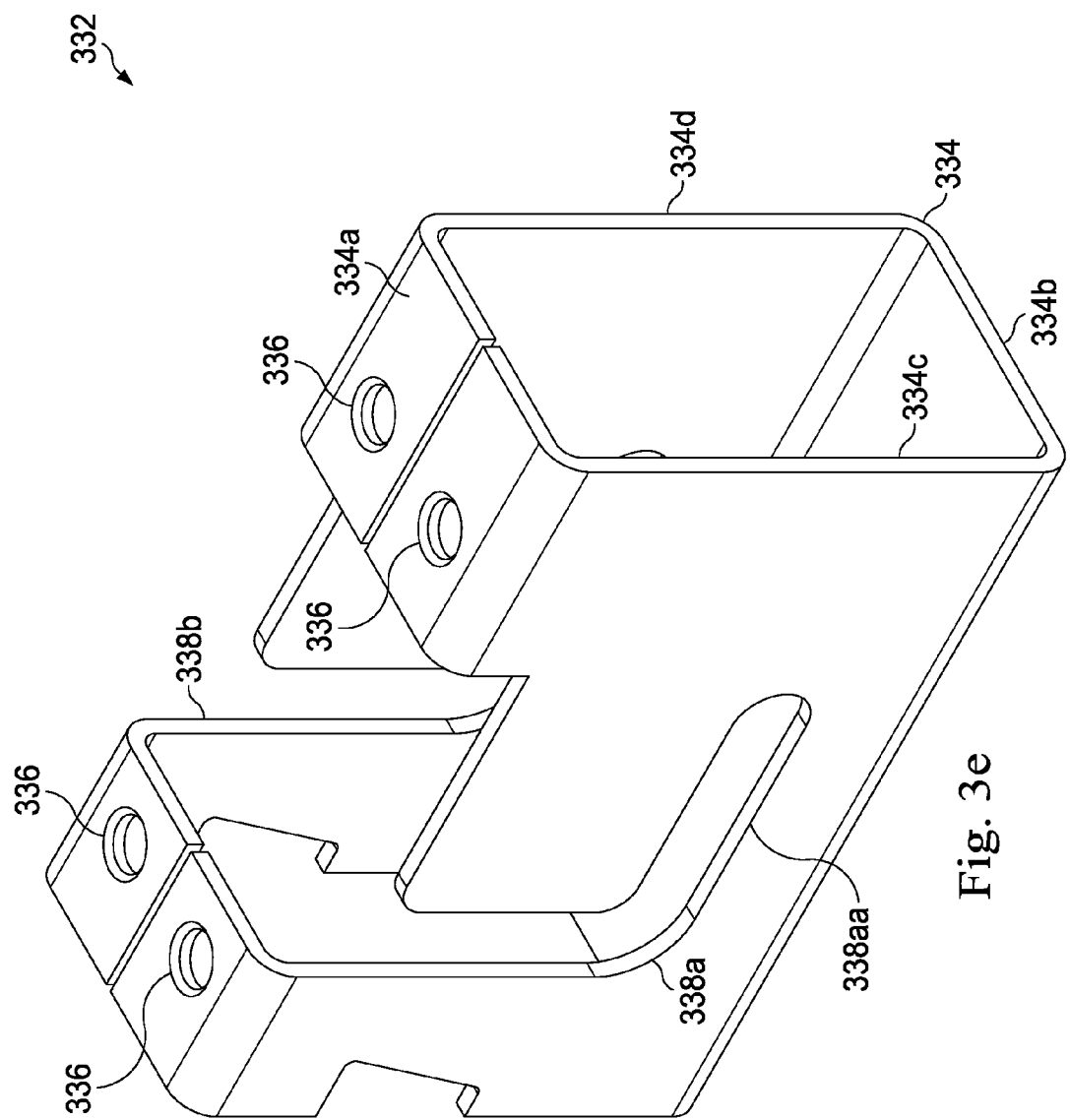
FIG. 3e is a perspective view illustrating an embodiment of a tray coupling member used with the rack attic base of FIGS. 3a and 3b and the rack tray of FIGS. 3c and 3d.

Referring now to FIG. 3e, an embodiment of a tray coupling member 332 is illustrated. The tray coupling member 332 includes a base 334, having a top wall 334a, a bottom wall 334b located opposite the base 334 from the top wall 334a, and a plurality of side walls 334c and 334d located opposite the base 334 from each other and extending between the top wall 334a and the bottom wall 334b. The top wall 334 defines a plurality of a rack attic base coupling apertures 336. The side wall 334c defines a moveable coupling slot 338a that includes a translational portion 338aa, and the side wall 334d defines a moveable coupling slot 338b that, while not completely visible in FIG. 3e, includes substantially similar dimensions and a substantially similar shape to the moveable coupling slot 338a (including the translational portion).

Figure 4A:
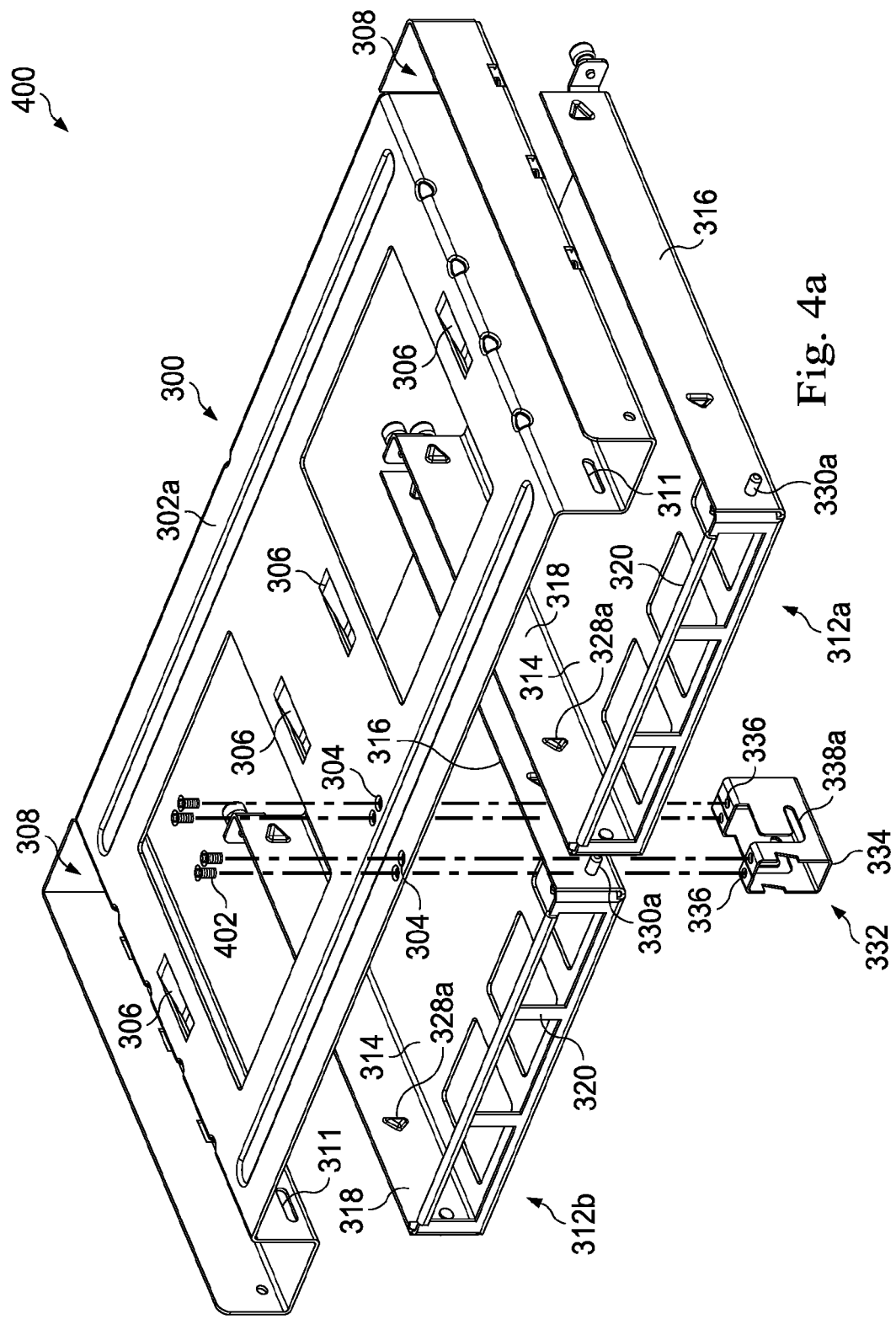
FIG. 4a is a top exploded perspective view illustrating an embodiment of a rack attic device coupling system including the rack attic base of FIGS. 3a and 3b, the rack tray of FIGS. 3c and 3d, and the tray coupling member of FIG. 3e.
Figure 4B:
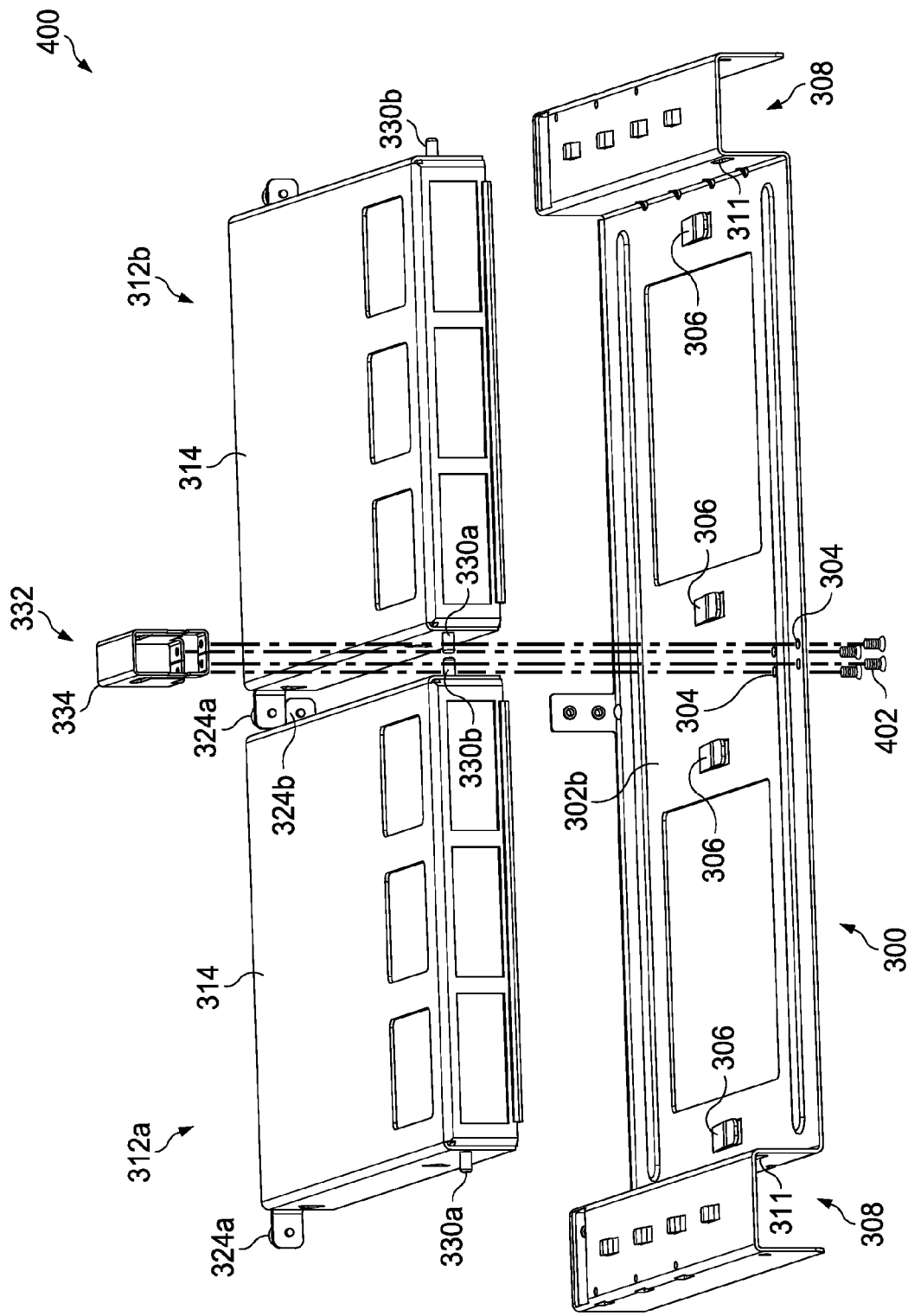
Figure 4C:
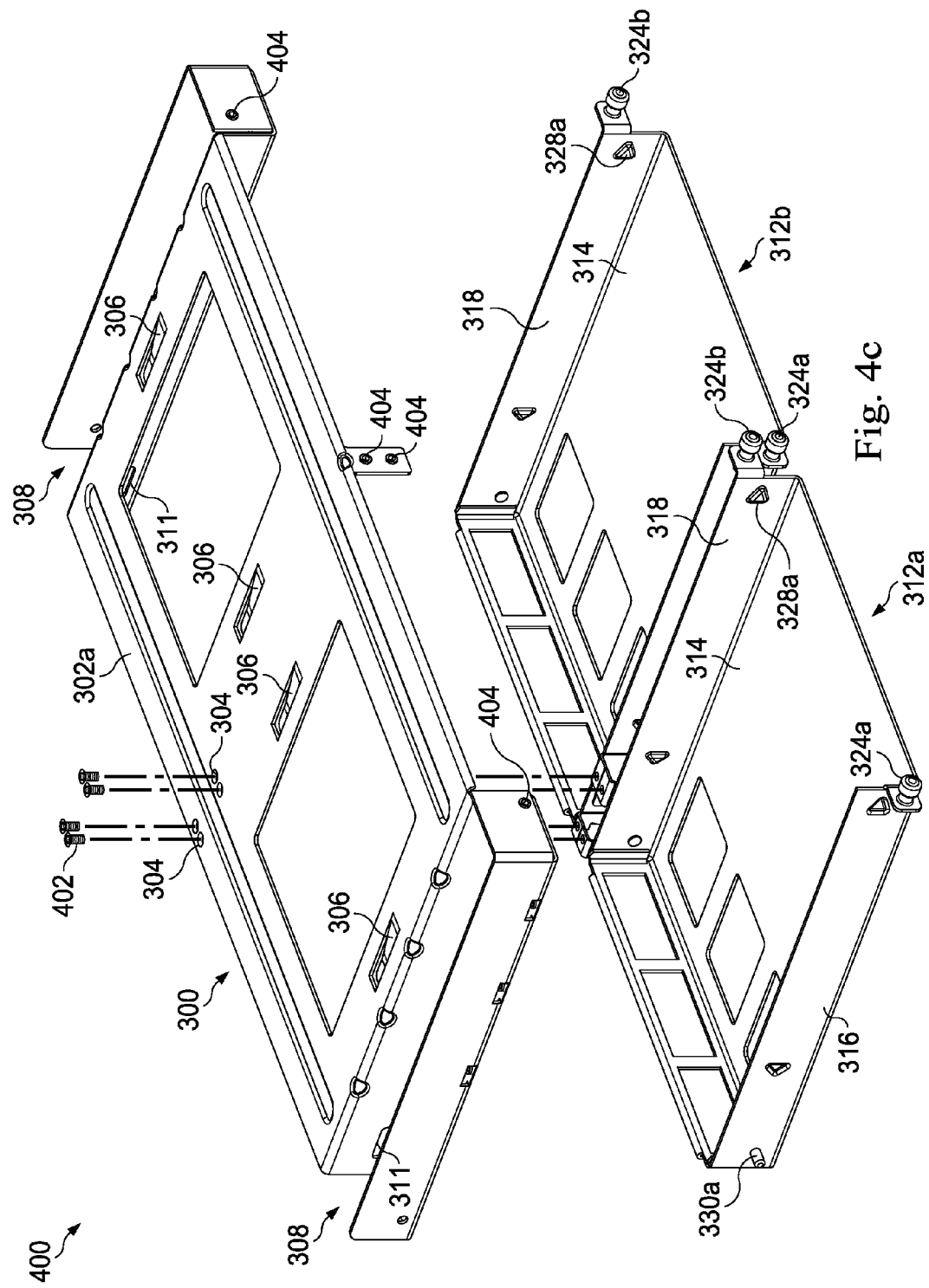
FIG. 4c is a bottom exploded perspective view illustrating an embodiment of the rack attic device coupling system of FIGS. 4a and 4b.
Figure 4D:
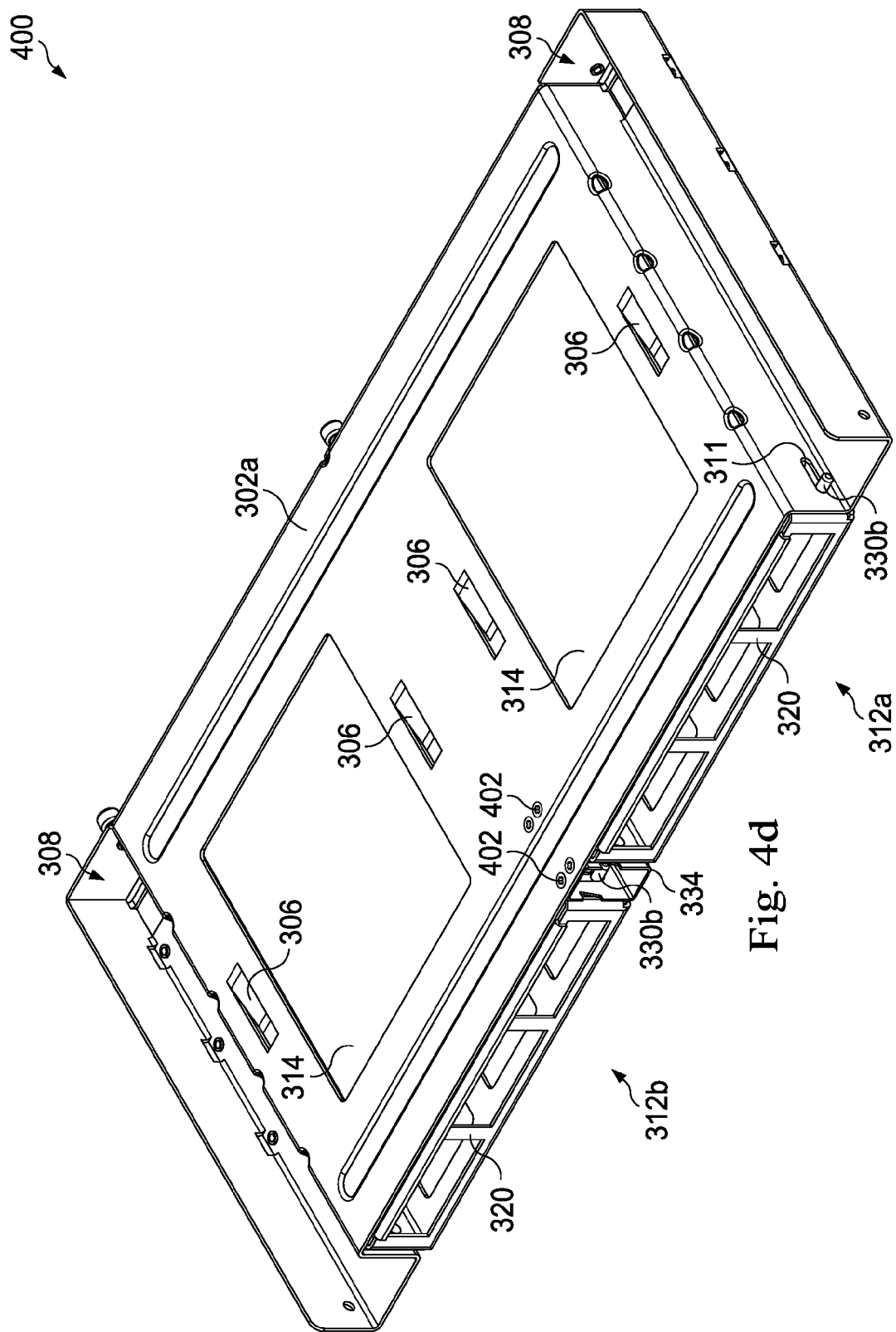
FIG. 4d is a top perspective view illustrating an embodiment of the rack attic device coupling system of FIGS. 4a-4c.
Figure 4E:
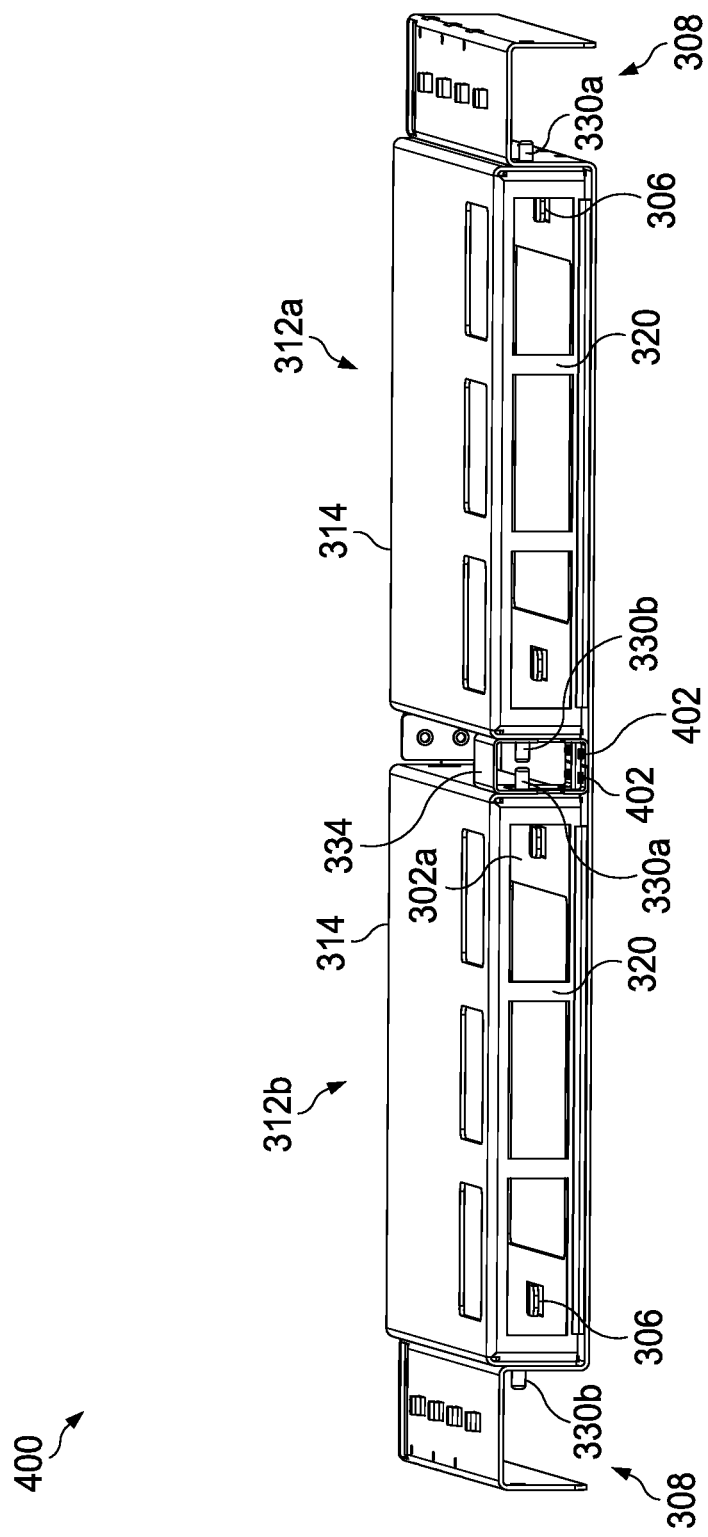
FIG. 4e is a bottom perspective view illustrating an embodiment of the rack attic device coupling system of FIGS. 4a-4c.
Figure 4F:
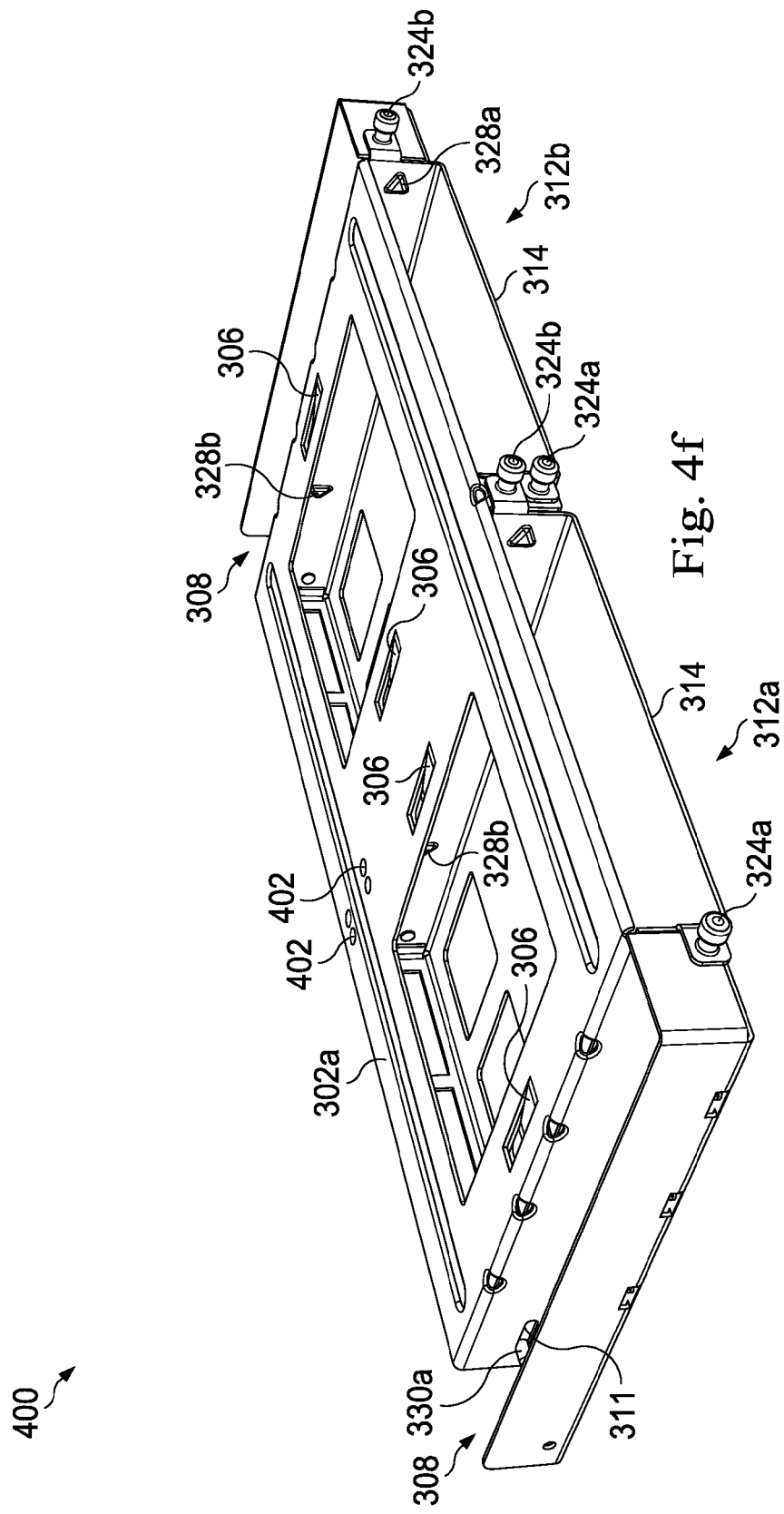
FIG. 4f is a bottom perspective view illustrating an embodiment of the rack attic device coupling system of FIGS. 4a-4c.

Referring now to FIGS. 4a, 4b, 4c, 4d, 4e, and 4f, an embodiment of a rack attic device coupling system 400 is illustrated. As discussed in further detail below, the FIGS. 4a-4c illustrated an exploded view of the rack attic device coupling system 400 including the rack attic base 300, two of the rack trays 312, and the tray coupling member 332, while FIGS. 4d-4f illustrated an assembled view of the rack attic coupling system 400 including the rack attic base 300, two of the rack trays 312, and the tray coupling member 332. As can be seen in FIGS. 4a-4f, the tray coupling member 332 may be coupled to the rack attic base 300 by aligning the rack attic base coupling members 336 on the tray coupling member 332 with the tray coupling member apertures 304 on the rack attic base 300 and then positioning fasteners 402 (e.g., the screws in the illustrated embodiment) in each of the aligned rack attic base coupling member 336/tray coupling member aperture 304 as illustrated.

A plurality of the rack trays 312 may then be coupled to the rack attic base 300 and the tray coupling member 332. In the illustrated embodiment, a first rack tray 312a is coupled to the rack attic base 300 by positioning the moveable coupling 330a on the first rack tray 312a in one of the tray coupling slots 311 on the rack attic tray 300, and that first rack tray 312a is coupled to the tray coupling member 332 by positioning the moveable coupling 330b on the first rack tray 312a in the moveable coupling slot 338a on the tray coupling member 332. Similarly, a second rack tray 312b is coupled to the rack attic tray 300 by positioning the moveable coupling 330b on the second rack tray 312b in one of the tray coupling slots 311 on the rack attic tray 300, and that second rack tray 312b is coupled to the tray coupling member 332 by positioning the moveable coupling 330a on the second rack tray 312b in the moveable coupling slot 338b on the tray coupling member 332. With the first rack tray 312a and the second rack tray 312b coupled to the rack attic base 300 and the tray coupling member 332 as discussed above, the first rack tray 312a and the second rack tray 312b are configured to pivot about those connections. Furthermore, as can be seen in FIG. 4c, the rack attic base 300 includes tray securing features 404 that the securing features 324a and 342b on the first rack tray 312a and the second rack tray 312b may engage (e.g., via the thumb screw securing members and corresponding features as illustrated) to secure the first rack tray 312a and the second rack tray 312b in place such that they do not pivot about their connections to the rack attic tray 300 and the tray coupling member 332. However, a variety of securing methods for preventing movement of the rack trays 312 relative to the rack attic base 300 are envisioned as falling within the scope of the present disclosure.

As can be seen in FIG. 4f, the securing member 324a on the second rack tray 312b and the securing member 324b on the first rack tray 312a may be positioned in a one-on-top-of-the-other orientation when they are secured to the tray securing features 404 on the rack attic base 300. When it is desired to pivot the first rack tray 312a about its connections to the rack attic tray 300 and the tray coupling member 332, the securing members 324a and 324b on the first rack tray 312a may be unsecured from the respective tray securing features 404 on the rack attic base 300, and then the first rack tray 312a may be translated relative to the rack attic base 300 by moving the moveable coupling 330a on the first rack tray 312a through the tray coupling slot 311 on the rack attic base 300 and moving the moveable coupling 330b on the first rack tray 312a through the translational portion 338aa of the moveable coupling slot 338a on the tray coupling member 332. This allows the securing member 324b on the first rack tray 312a to be moved past the securing member 324a on the second rack tray 312b (which is secured to the rack attic base 300) such that the first rack tray 312a may then be pivoted about its connections to the rack attic tray 300 and the tray coupling member 332 as discussed above. As such, either or both of the first rack tray 312a and the second rack tray 312b may be pivotally/rotationally as well as translationally coupled to the rack attic base 300 and the tray coupling member 332 to provide such functionality as desired.

Figure 5A:
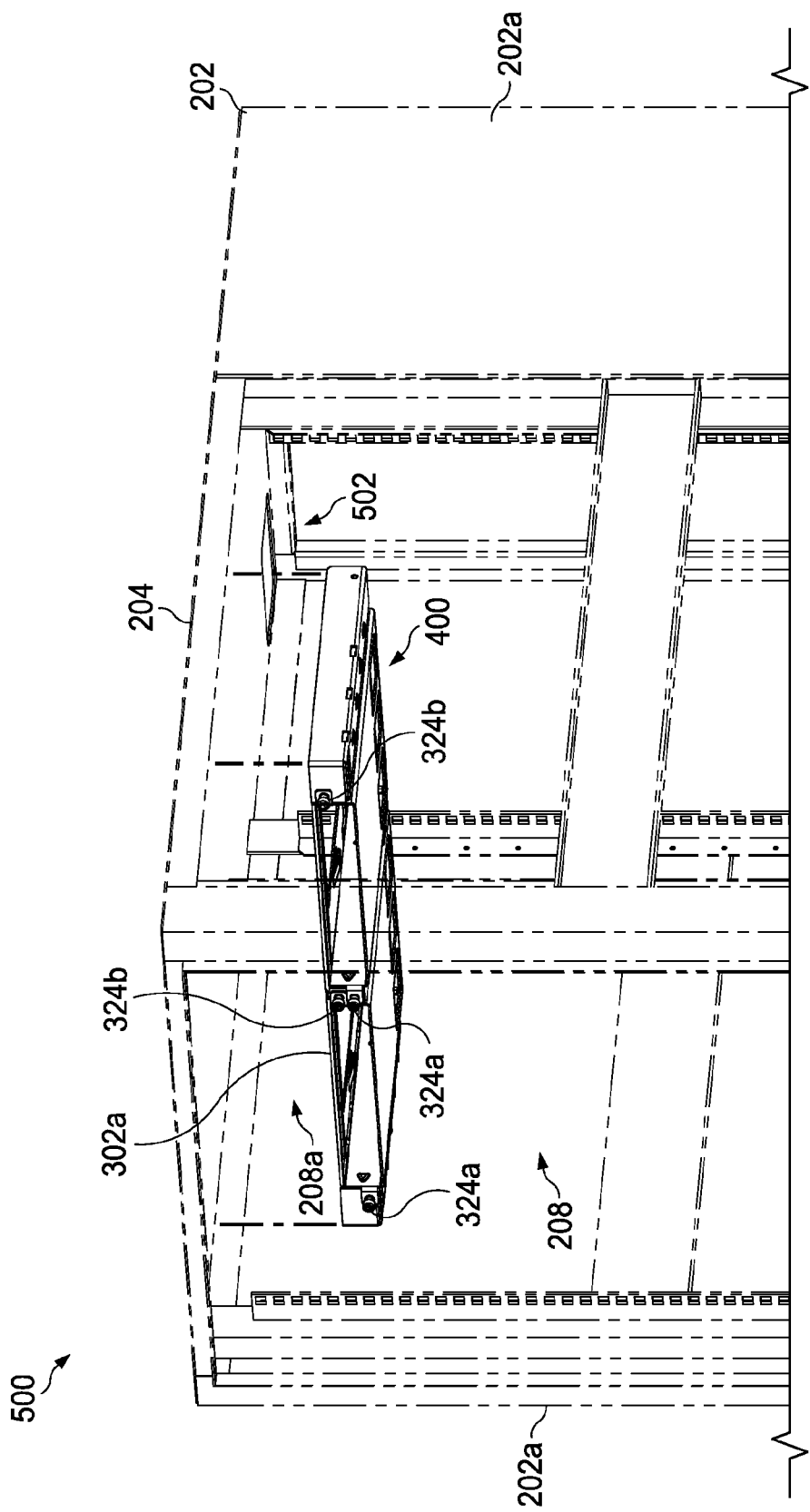
FIG. 5a is a perspective view illustrating an embodiment of the rack attic device coupling system of FIGS. 4d-4f being coupled to the rack of FIG. 2 in a forward-facing orientation.
Figure 5B:
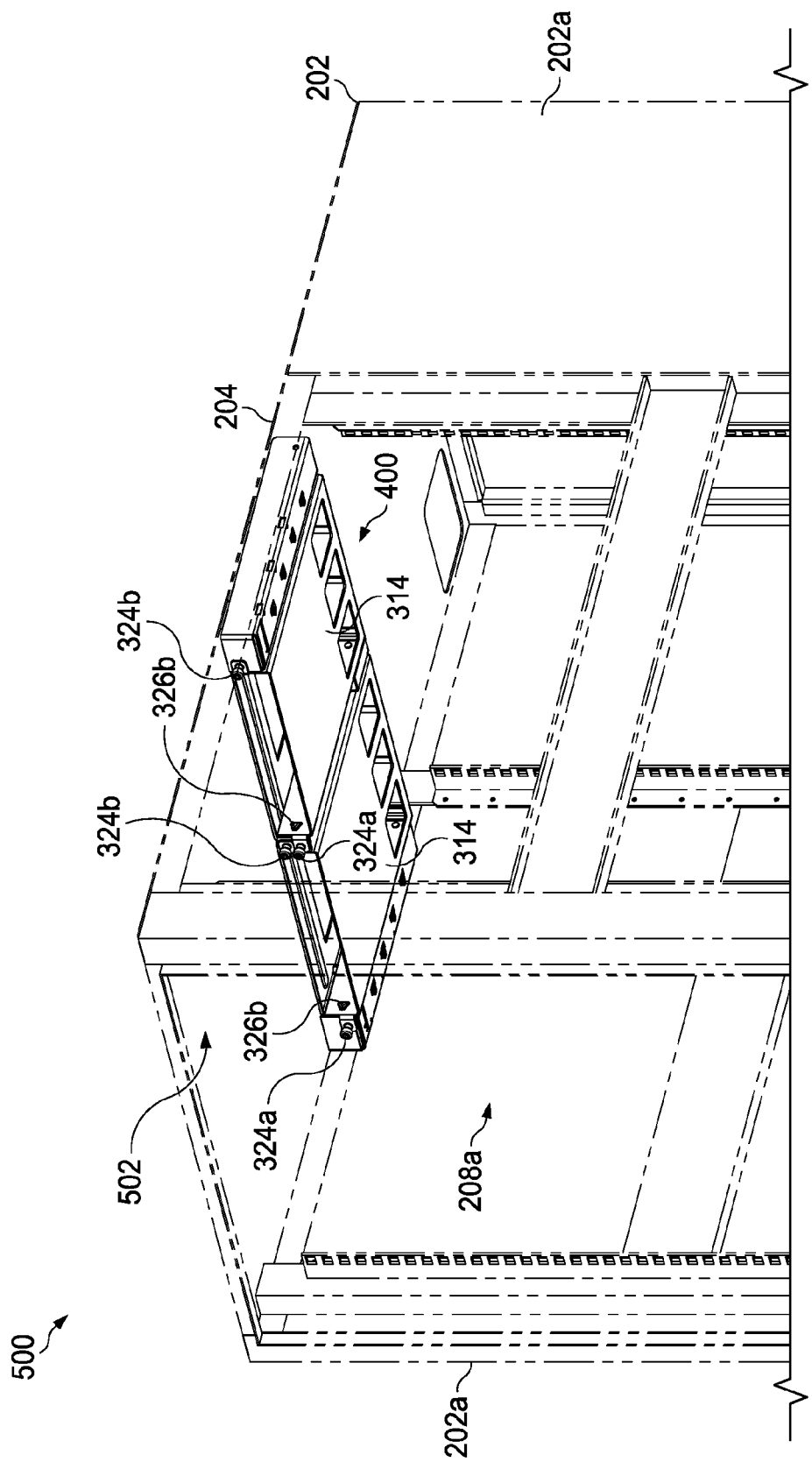
FIG. 5b is a perspective view illustrating an embodiment of the rack attic device coupling system of FIGS. 4d-4f coupled to the rack of FIG. 2 in the forward-facing orientation.

Referring now to FIGS. 5a, 5b, and 5c, an embodiment of a rack system 500 is illustrated. The illustrated embodiment of the rack system 500 provides a "front-facing" rack attic device coupling system that is discussed in further detail below. The rack system 500 is provided by positioning the rack attic device coupling system 400 in the rack 200 by moving the rack attic device coupling system 400 through one of the device slots 208 such that it is located adjacent a rack "attic" 502 defined by the rack top wall 204. As illustrated and described in further detail below, the rack top wall 204 may include lips, edges, and/or other features that cause the rack top wall 204 to define a rack attic volume 502 that is located adjacent the first device slot 208a. As illustrated in FIGS. 5b and 5c, after being moved adjacent the rack attic volume 502 as illustrated in FIG. 5a, the rack attic device coupling system 400 may be mounted to the rack top wall 204 (e.g., using features on the top surface 302a of the rack attic base 300 and features on the rack top wall 204) to position and secure the rack attic device coupling system 400 in the rack attic 502. With the rack attic device coupling system 400 mounted to the rack top wall 204, the rack attic device coupling system 400 is positioned in the rack attic 502 and adjacent the first device coupling slot 208a.

Figure 6A:
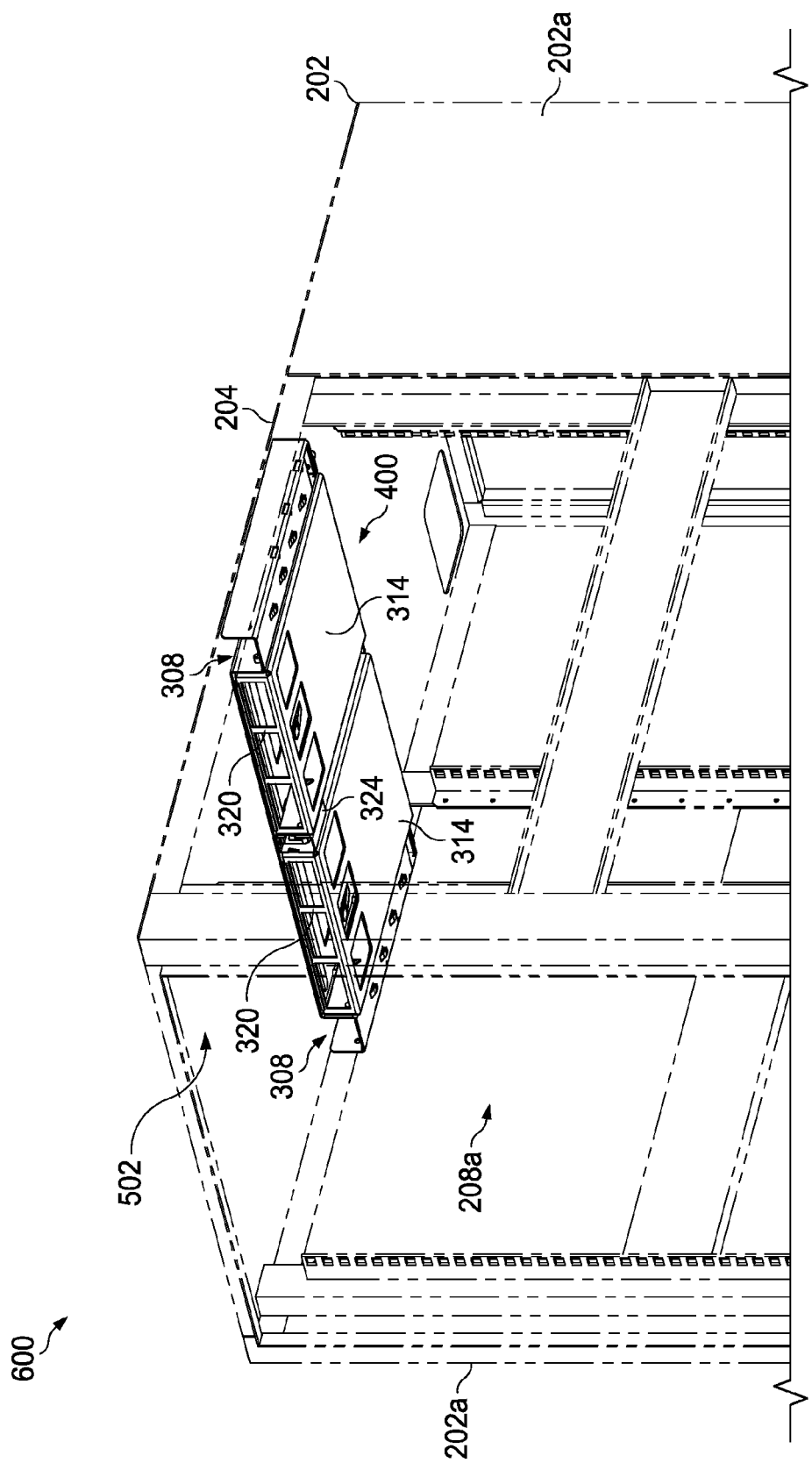
FIG. 6a is a perspective view illustrating an embodiment of the rack attic device coupling system of FIGS. 4d-4f coupled to the rack of FIG. 2 in a rear-facing orientation.
Figure 6B:
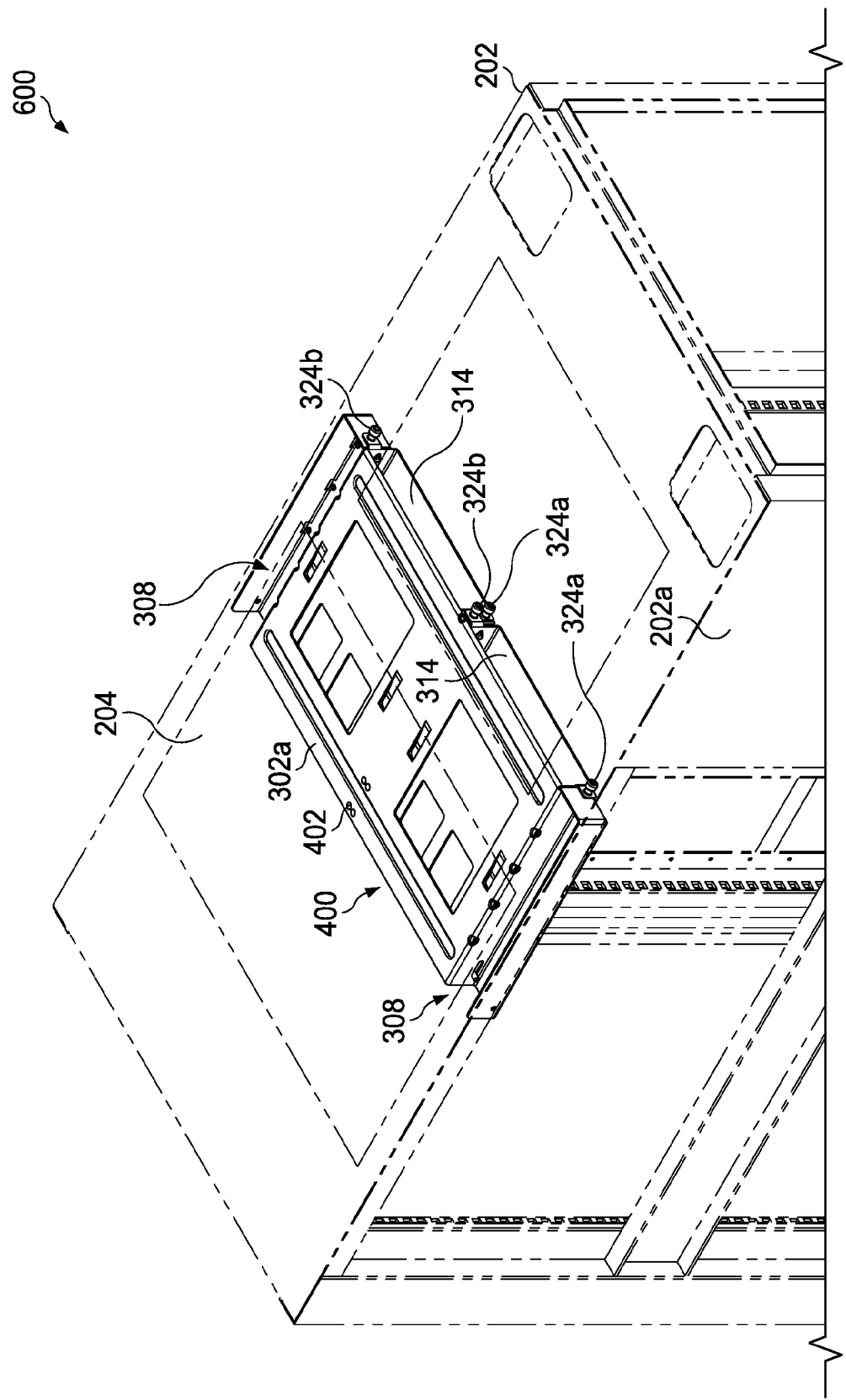
FIG. 6b is a perspective view illustrating an embodiment of the rack attic device coupling system of FIGS. 4d-4f coupled to the rack of FIG. 2 in the rear-facing orientation.
Figure 6C:
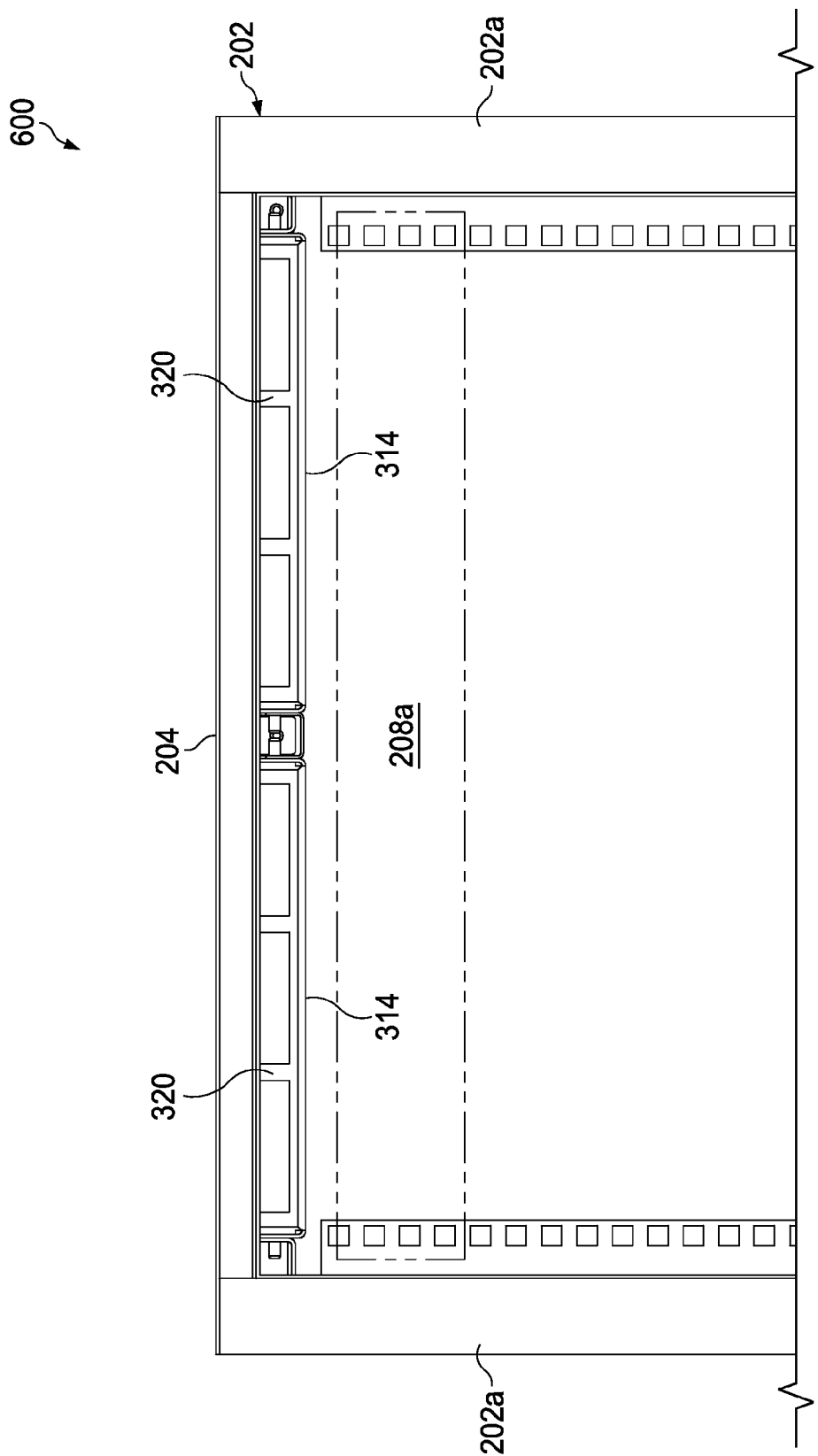
FIG. 6c is a front view illustrating an embodiment of the rack attic device coupling system of FIGS. 4d-4f coupled to the rack of FIG. 2 in the rear-facing orientation.

Referring now to FIGS. 6a, 6b, and 6c, an embodiment of a rack system 600 is illustrated. The illustrated embodiment of the rack system 600 provides a "rear-facing" rack attic device coupling system. The rack system 600 is provided similarly as discussed above with respect to the rack system 500, but with the rack attic device coupling system 400 rotated 180 degrees about a plane that is parallel to the rack top wall 204 relative to the front-facing rack attic device coupling system illustrated in FIGS. 5a-5c. The rear-facing rack attic device coupling system of FIGS. 6a-6c configures the rack attic device coupling system 400 to receive devices through the "rear" of the rack 200 rather than through the "front" of the rack 200 (as occurs with the front-facing rack attic device coupling system illustrated in FIGS. 5a-5c and discussed below). As illustrated in FIGS. 6a, 6b, and 6c, after being moved adjacent the rack attic volume 502, the rack attic device coupling system 400 may be mounted to the rack top wall 204 (e.g., using features on the top surface 302a of the rack attic base 300 and features on the rack top wall 204) to position and secure the rack attic device coupling system 400 in the rack attic volume 502. With the rack attic device coupling system 400 mounted to the rack top wall 204, the rack attic device coupling system 400 is positioned in the rack attic 502 adjacent the first device coupling slot 208a and obstructed by the rack top wall 204 from moving parallel to the rack top wall 204 and out of the rack 200, as illustrated in FIG. 6c. While the rear-facing rack attic device coupling system in the rack system 600 is not discussed extensively below, one of skill in the art in possession of the present disclosure will recognize how the operation of the rack system 500 with the front facing rack attic device coupling system that is described in detail below may be applied to the rear facing rack attic device coupling system while remaining within the scope of the present disclosure.

Figure 7:
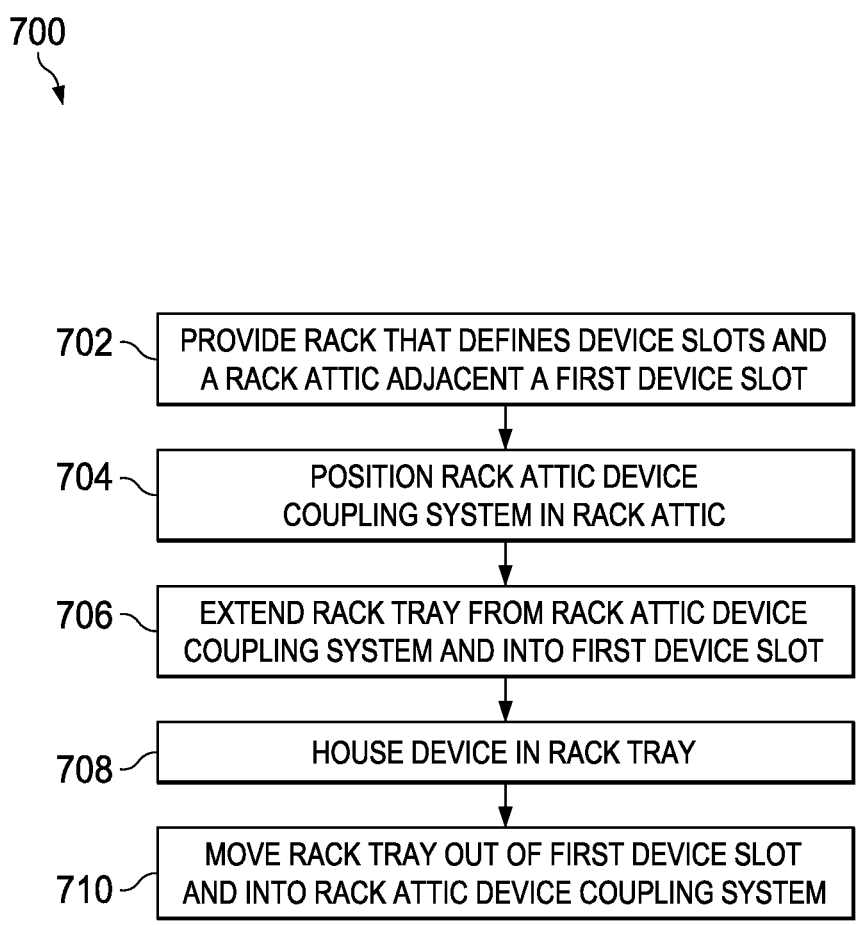
FIG. 7 is a flow chart illustrating an embodiment of a method for coupling a device to a rack.

Referring now to FIG. 7, an embodiment of a method 700 for coupling a device to a rack is illustrated. As discussed above, while the method 700 is discussed with regard to a rack attic device coupling system that is configured to couple devices in a rack attic defined by a rack, the method 700 may apply to any of a variety of rack volume device coupling systems that couple devices to rack volumes that may have been previously unutilized in the rack. The method 700 begins at block 702 where a rack is provided that defines devices slots and a rack attic adjacent a first device slot. In an embodiment, the rack 200 discussed above with reference to FIG. 2 that defines the device slots 208 including the first device slot 208a, as well as the rack attic 502, is provided. The method 700 then proceeds to block 704 where a rack attic device coupling system is positioned in the rack attic. In an embodiment, the rack attic device coupling system 400 may be coupled to the rack 200 to provide the rack system 500 discussed above with reference to FIGS. 5a-5c, to provide the rack system 600 discussed above with reference to FIGS. 6a-6c, and/or to provide a variety of other rack systems that utilize the rack volume device coupling systems of the present disclosure. In some examples, blocks 702 and 704 of the present disclosure may be performed by a rack user to upgrade a conventional rack with the rack attic device coupling system in order to allow that conventional rack to house devices in a rack attic defined by that conventional rack. In other embodiments, blocks 702 and 704 of the present disclosure may be performed by a rack manufacturer to produce a rack according to the teachings of the present disclosure with the rack attic device coupling system that allows that rack to house devices in a rack attic defined by that rack.

The method 700 then proceeds to block 706 where a rack tray is extended from the rack attic device coupling system and into the first device slot. Referring first to FIGS. 8a and 8b, the rack system 500 discussed above with reference to FIG. 5 is illustrated with a plurality of devices 800 positioned in the device slots 208 defined by the rack 200, including a first device 800a positioned in the first device slot 208a. In some embodiments, the devices 800 and 800a may be the HIS 100 of FIG. 1 and/or include some or al of the component of the HIS 100. As such, the devices 800 and 800a may be any of a variety of rack devices including servers, storage systems, networking systems, and/or other rack devices known in the art. As can be seen in FIG. 8a, with the device 800a positioned in the first device slot 208a, the rack trays 312 are prevented from moving out of the rack attic 502 by the device 800a. Similarly, FIG. 8b illustrates how the device 800a is moved out of the first device slot 208a in order to move the device trays 312 out of the rack attic 502 to extend into the first device slot 208a (such that a device 802 may be positioned in the rack tray 312, discussed below).

Figure 8C:
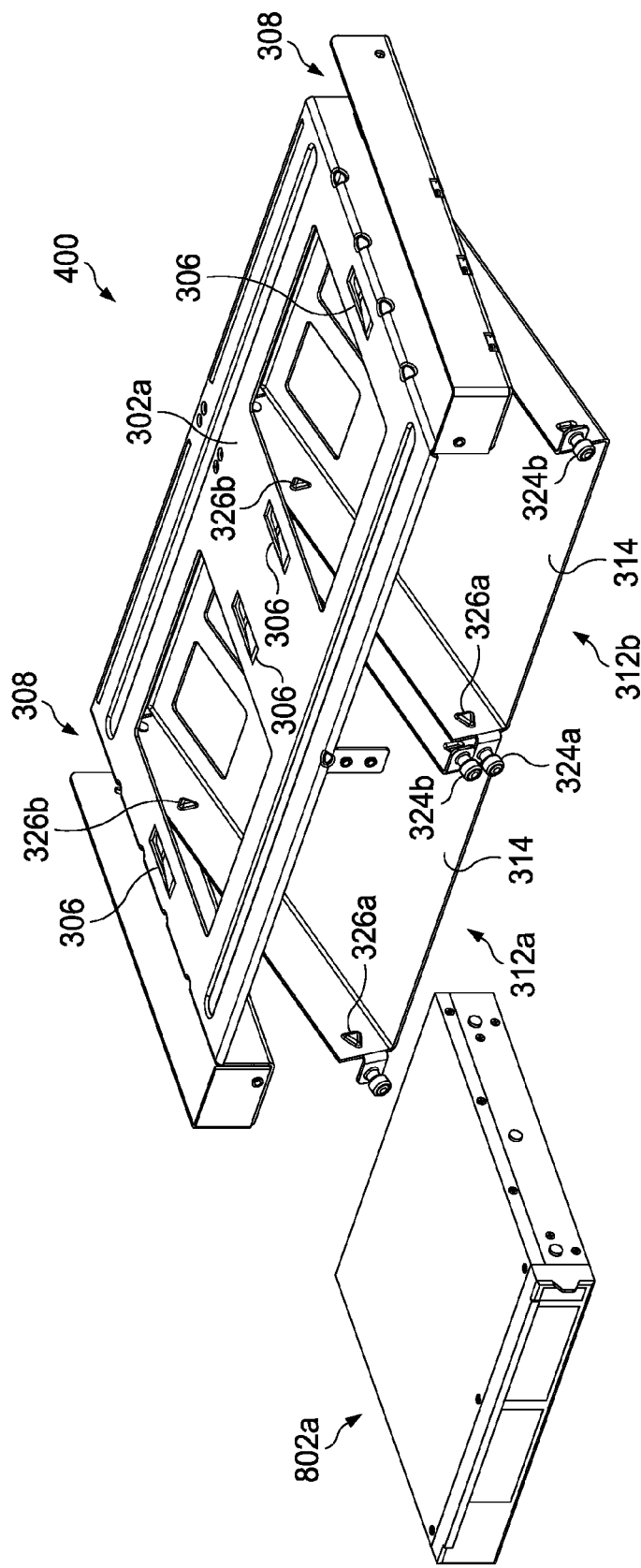
FIG. 8c is a perspective view illustrating an embodiment of a device being coupled to the rack attic device coupling system of FIGS. 4d-4f.

Referring now to FIGS. 8c, 8d, 8e, and 8f, the coupling of the devices to the rack attic device coupling system 400 is illustrated without the rack for clarity. Referring first to FIGS. 8c and 8d, one or both of the first rack tray 312a and the second rack tray 312b may be rotated/pivoted about its connections to the rack attic base 300 and the tray coupling member 332 such that it extends from the rack attic 502 defined by the rack 200 and into the first device slot 208a. As discussed above, in the illustrated embodiment, the first rack tray 312a may translated relative to the rack attic base 300 such that the securing member 324b on the first rack tray 312a "clears" the securing member 324a on the second rack tray 312b to allow for the rotation/pivoting discussed above. The method 700 then proceeds to block 708 where a device is housed in the rack tray. As illustrated in FIGS. 8c and 8d, a first device 802 may be positioned adjacent the first rack tray 312a when the first rack tray 312a extends into the first device slot 208a, and then moved towards the first rack tray 312a such that the bottom surface of the first device 802a engages the pair of device engagement features 326a and 328a on the first rack tray 312a. One of skill in the art in possession of the present disclosure will recognize that the device engagement features 326a and 328a allow the first device 802a to be moved into the tray housing 322 defined by the first rack tray 312a at a variety of angles relative to the base 314 of the first rack tray 312a. Continued movement of the first device 802a towards the first rack tray 312a causes the first device 802a to become positioned in the tray housing 322 defined by the first rack tray 312a when the bottom surface of the first device 802a moves past the pair of device engagement features 326a and 328a on the first rack tray 312a and "drops" into the tray housing 322 defined by the first rack tray 312a, while becoming engaged with the device engagement features 326b and 328b on the first rack tray 312a to secure the first device in the first rack tray 312a, discussed in further detail below.

Figure 8F:
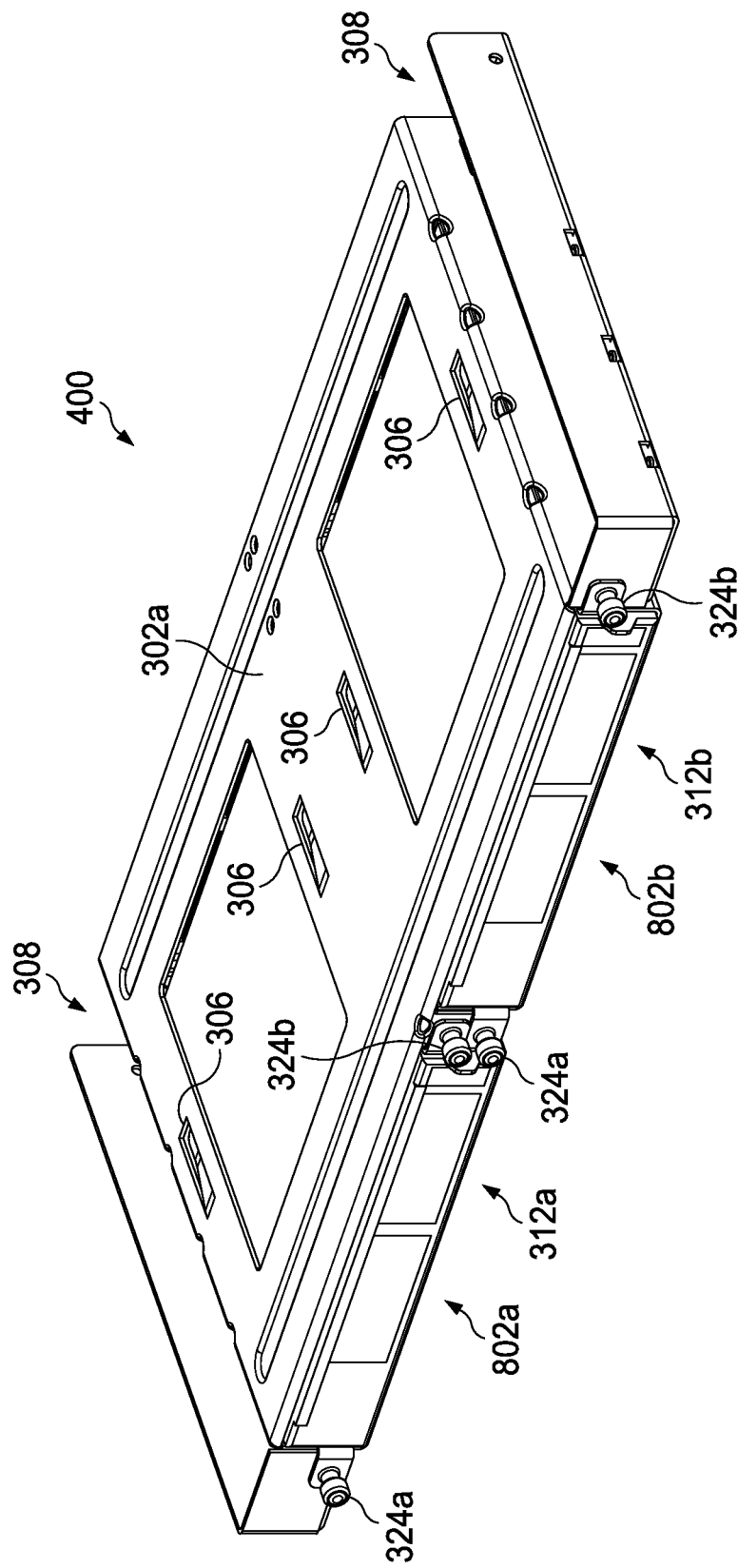
FIG. 8f is a perspective view illustrating an embodiment of a pair of devices coupled to the rack attic device coupling system of FIGS. 4d-4f.

The method 700 then proceeds to block 710 where the rack tray is moved out of the first device slot and into the rack attic device coupling system. As illustrated in FIG. 8e, with the first device 802a secured in the tray housing 322 defined by the first rack tray 312a, the first rack tray 312a may be rotating/pivoted about its connections to the rack attic base 300 and the tray coupling member 332 such that the first device 802a is moved from the first device slot 208a and into the rack attic 502, and the securing members 324a and 324b may be secured to the rack attic base 300. In an embodiment, movement of the first rack tray 312a into the rack attic 502 causes the device engagement features 306 on the rack attic base 300 to engage the top surface of the first device 802a, which operates (e.g., via a spring force) to hold the first device 802a in place and prevent vibrations of the first device 802a in the tray housing 322 (e.g., when the securing members 324a and 324b on the first rack tray 312a are secured to the rack attic base 300.) FIGS. 8e and 8f illustrated how blocks 706, 708, and 710 may be performed for a second device 802b in the second rack tray 312b the same manner as discussed above for the first device 802a in the first rack tray 312a. As such, a first device 802a and a second device 802b may be positioned in the rack attic 502 defined by the rack 200 using the rack attic device coupling system 400 as provided in the rack system 500 discussed above.

With the first device 802a and the second device 802b secured in the first rack tray 312a and the second rack tray 312b and located in the rack attic 502, those devices may be coupled to other devices in the rack 202 and/or other racks. For example, the first device 802a and the second device 802b may be networking devices such as switches or routers that are coupled to servers and/or storage system (e.g., the devices 800 and 800a) located in the rack 200. Routing channels 314a and 320a defined by the rack trays 312 may be utilized to access features on the devices 312, as well as to route cabling to and/or from the devices 312, and the routing channels 308 defined by the rack attic base 300 may be used to further route cabling through the rack attic base 300 and to different parts of the rack 200 and/or other racks. A variety of other cable routing and securing features may be provided on the rack trays 312 and the rack attic base 300 while remaining within the scope of the present disclosure.

Figure 8G:
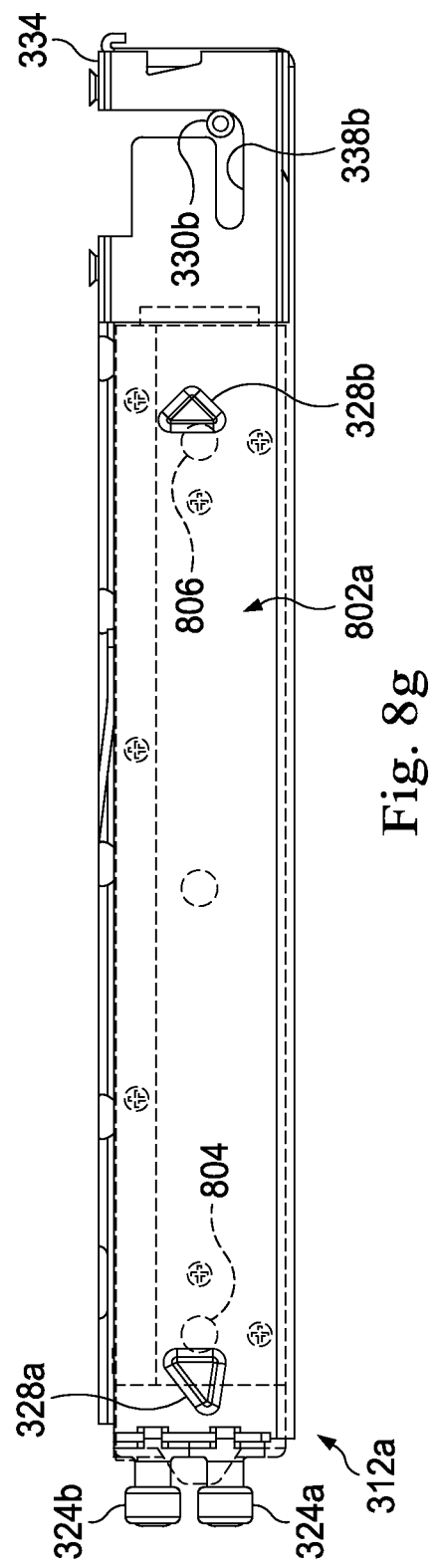
FIG. 8g is a side view illustrating an embodiment of a device coupled to the rack attic device coupling system of FIGS. 4d-4f.
Figure 8H:
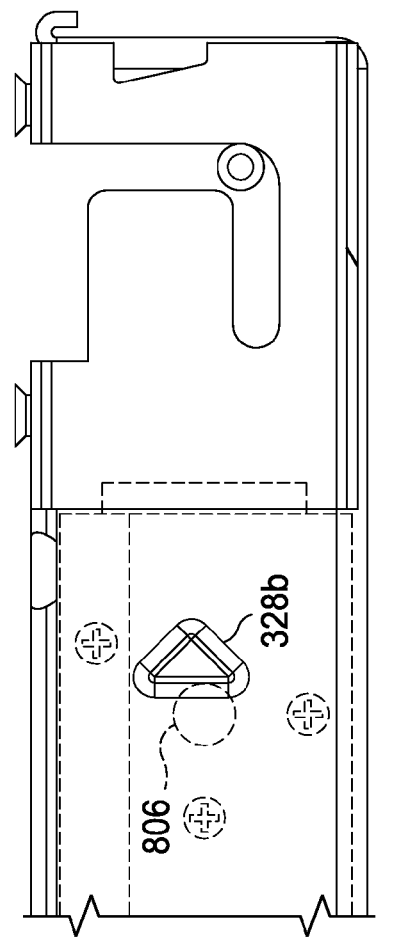
FIG. 8h is a partial side view illustrating an embodiment of a device coupled to the rack attic device coupling system of FIGS. 4d-4f.
Figure 8H:
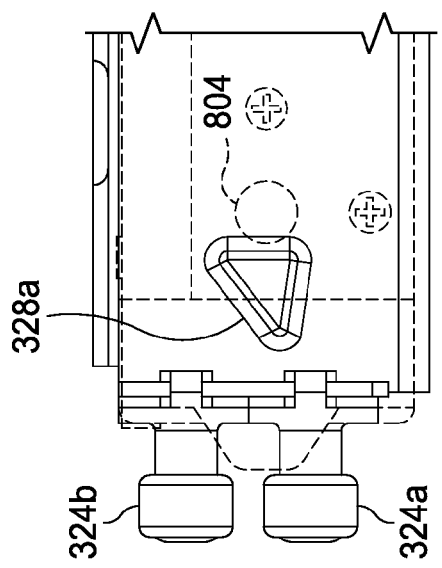

Referring now to FIGS. 8g and 8h, an embodiment of the securing of a device in a rack tray is illustrated in more detail. FIG. 8g illustrates how the first device 802a that is positioned in the first rack tray 312a may include device features 804 and 806 that engage the device engagement features 328a and 328b (as well as device features (not illustrated) that engage the device engagement features 326a and 326b on the first device tray 312a) to secure the first device 802a in the tray housing 322 defined by the first rack tray 312a. As such, when the first rack tray 312a is rotated/pivoted about its connections to the rack attic base 200 and the tray coupling member 332 such that it extends into the first device slot 208a, the first device 802a will remain in the tray housing 322 defined by the first rack tray 312a (due to its engagement with the device engagement features 326a and 328a). To remove the first device 802a from the first rack tray 312a, the first device 802a is then lifted out of the tray housing 322 defined by the first rack tray 312a such that the device feature 804 (and corresponding device features on the other side of the first device 802a) clears the device engagement features 326a and 328a on the first rack tray 312a, which allows the first device 802a to be slid along the engagement of its bottom surface with the device engagement features 326a and 328a and out of the tray housing 322 of the first rack tray 312a. One of skill in the art in possession of the present disclosure will recognize that similar functionality may be provided for the second device 802b in the second rack tray 312b.

Figure 8I:
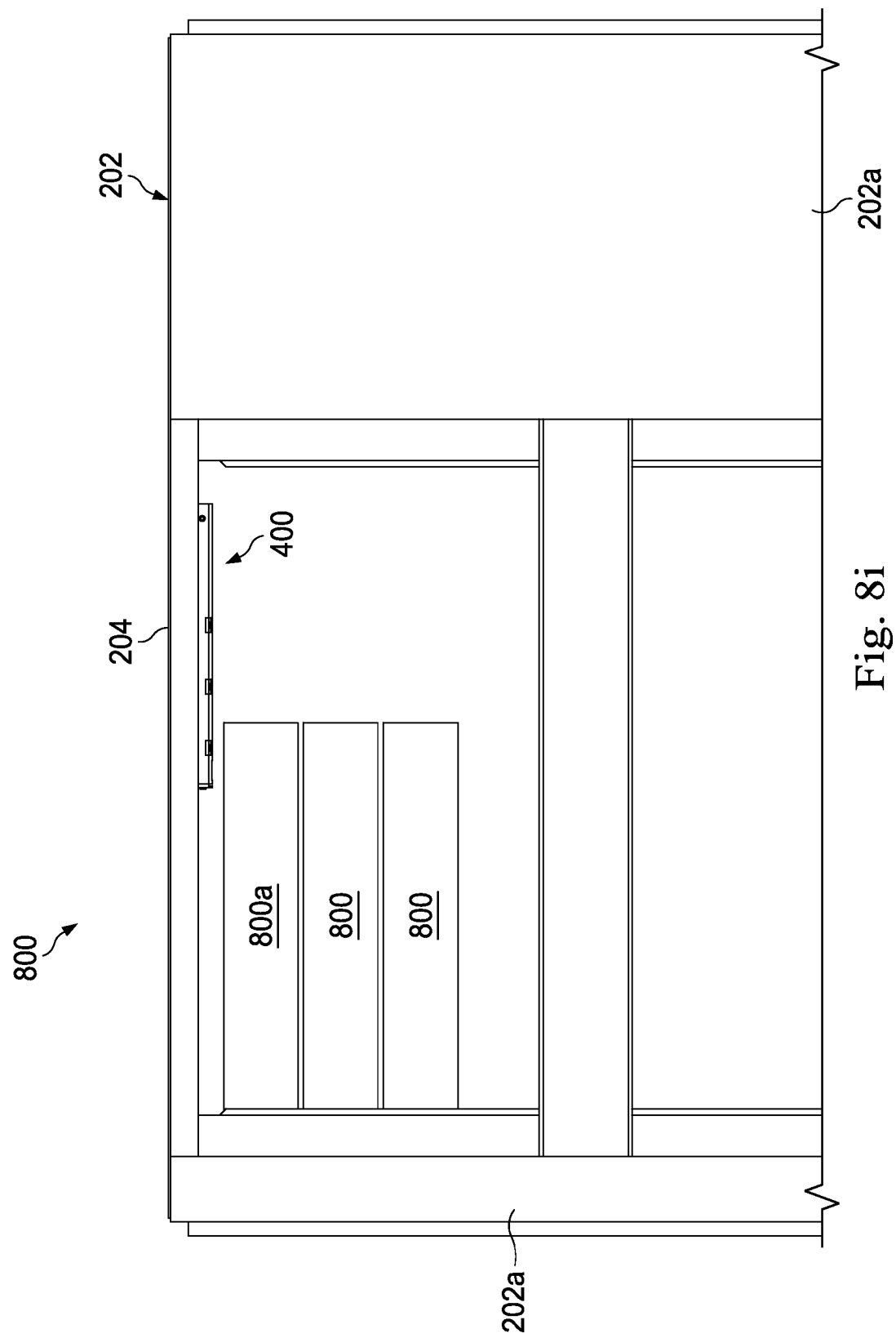
FIG. 8i is a side view illustrating an embodiment of the rack attic device coupling system of FIGS. 4d-4f positioned in the rack of FIG. 2 with a plurality of devices coupled to the rack.
Figure 8J:
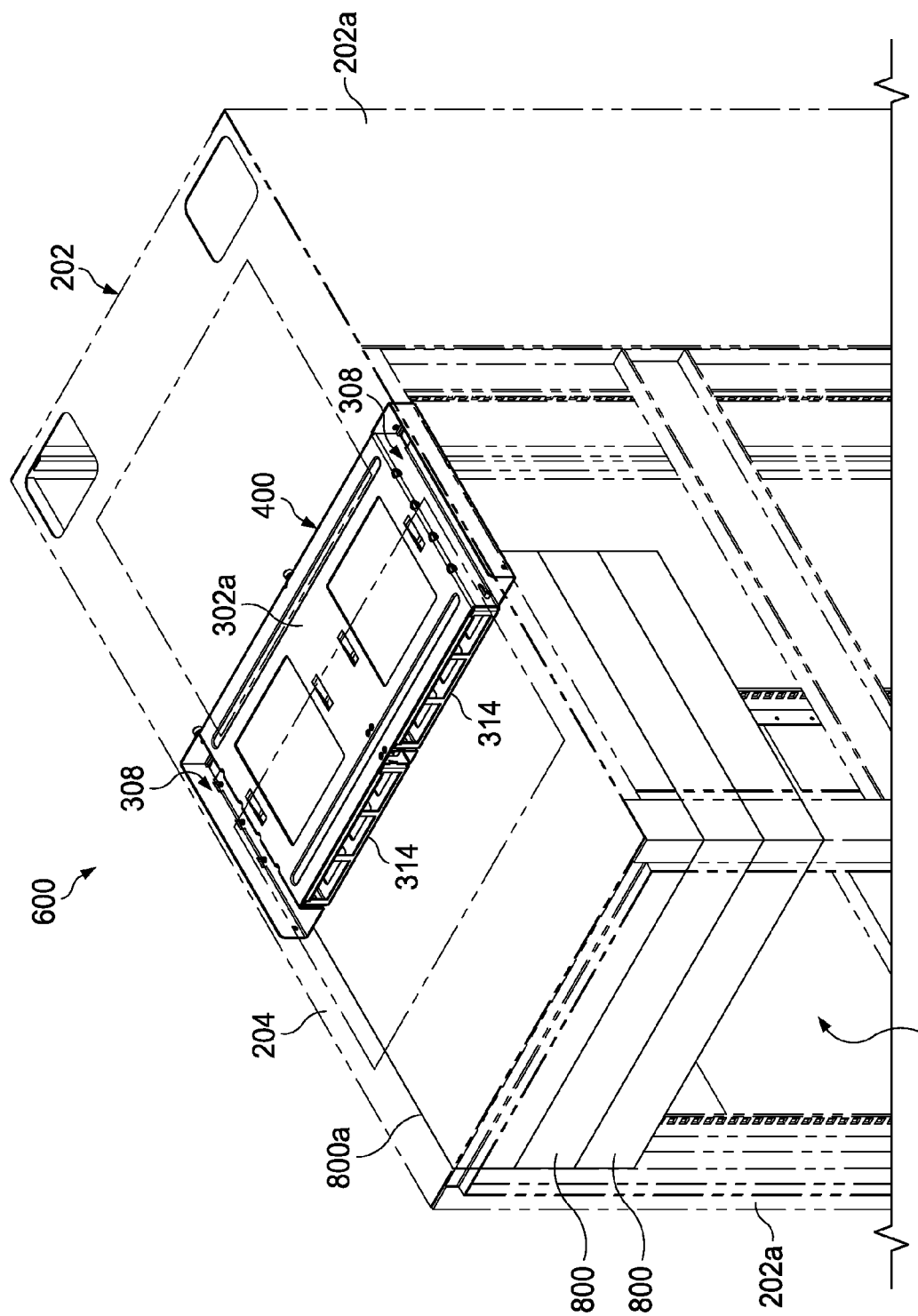
FIG. 8j is a perspective view illustrating an embodiment of the rack attic device coupling system of FIGS. 4d-4f positioned in the rack of FIG. 2 with a plurality of devices coupled to the rack.

FIG. 8i illustrates how, after the first rack tray 312a and the second rack tray 312b are moved out of the first device slot 208a and secured to the rack attic base 300 to position the first device 802a and the second device 802b in the rack attic 502, the first device 800a may be positioned in the first device slot 208a. As such, the devices 800 can be coupled to the rack 200 in a conventional manner while utilizing the rack attic 502 to position multiple devices in a volume of the rack 200 that was previously unutilized. FIG. 8j illustrates the rack attic device coupling system 400 oriented in a rear-facing orientation as discussed above with reference to FIGS. 6a-6c, with a plurality of devices 800 coupled to the rack 200 as discussed above. One of skill in the art in possession of the present disclosure will recognize how the operation of the rear-facing rack attic device coupling system may utilize the teachings above to allow devices to be positioned in the rack attic 502 through the rear of the rack 200 while remaining within the scope of the present disclosure.

Thus, systems and methods have been described that provide a rack attic device coupling system that may be mounted to or otherwise including in a rack in order to couple devices to the rack using volumes defined by the rack that were previously not utilized. In the examples described above, the rack attic device coupling systems allows devices to be positioned in the "attic" of a rack in order to utilize the rack more efficiently, and the rack attic device coupling system provides a number of features that enables the safe coupling, storage, use, and removal of those devices in the rack attic to enable rack efficiencies not provided in conventional racks and rack systems.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A rack system, comprising:
   a rack base that defines a plurality of device slots;
   a rack wall that is included on the rack base and that defines a rack volume adjacent a first device slot of the plurality of device slots; and
   a rack volume device coupling system that is located in the rack volume, wherein the rack volume device coupling system includes:
   a rack volume base that is positioned in the rack volume and that defines a rack tray housing; and
   a first rack tray that is moveably coupled to the rack volume base, wherein the first rack tray is configured to:
   move from a first orientation in which the first rack tray is located in the rack tray housing and into a second orientation in which the first rack tray extends from the rack volume and into the first device slot;

receive and house a first device that is moved through the first device slot and into the first rack tray when the first rack tray is in the second orientation; and move from the second orientation and into the first orientation such that the first device is located in the rack volume, wherein the rack wall impedes access to the rack volume by the first device such that the first device must be moved through the first device slot and into the first rack tray to access the rack volume.

2. The rack system of claim 1, wherein the rack volume device coupling system includes:

a second rack tray that is moveably coupled to the rack volume base and located adjacent the first rack tray, wherein the second rack tray is configured to:

move from the first orientation in which the second rack tray is located in the rack tray housing and into the second orientation in which the second rack tray extends from the rack volume and into the first device slot;

receive and house a second device that is moved through the first device slot and into the second rack tray when the second rack tray is in the second orientation; and move from the second orientation and into the first orientation such that the second device is located in the rack volume.

3. The rack system of claim 1, wherein the first rack tray includes a plurality of device engagement features that are configured to engage the first device in order to resist movement of the first device relative to the first rack tray when the first rack tray is in the second orientation.

4. The rack system of claim 1, wherein the rack volume base includes a plurality of device engagement features that are configured to engage the first device in order to resist movement of the first device when the first rack tray is in the first orientation.

5. The rack system of claim 1, wherein the first rack tray is moveably coupled to the rack volume base by a pivotable coupling that is configured to allow the first rack tray to pivot relative to the rack volume base to move from the first orientation and into the second orientation, and a translational coupling that is configured to allow the first rack tray to translate relative to the rack volume base.

6. The rack system of claim 1, wherein the first rack tray defines at least one opening that provides access to the first device when the first device is positioned in the first rack tray and the first rack tray is in the first orientation.

7. A rack volume device coupling system, comprising:

a rack volume base that defines a rack tray housing, that includes a first plurality of device engagement features, and that is configured to mount to a rack; and a first rack tray that is configured to moveably couple to the rack volume base and that is configured to:

move from a first orientation in which the first rack tray is located in the rack tray housing and into a second orientation in which the first rack tray extends from the rack volume base;

receive and house a first device that is moved into the first rack tray when the first rack tray is in the second orientation; and move from the second orientation and into the first orientation such that the first device is located in the rack volume base, wherein the first plurality of device engagement features are configured to engage the first device in order to resist movement of the first device when the first rack tray is in the first orientation.

8. The rack volume device coupling system of claim 7, further comprising:

a second rack tray that is configured to moveably couple to the rack volume base and that is configured to:

move from the first orientation in which the second rack tray is located in the rack tray housing and into the second orientation in which the second rack tray extends from the rack volume base;

receive and house a second device that is moved into the second rack tray when the second rack tray is in the second orientation; and move from the second orientation and into the first orientation such that the second device is located in the rack volume base.

9. The rack volume device coupling system of claim 7, wherein the first rack tray includes a second plurality of device engagement features that are configured to engage the first device in order to resist movement of the first device relative to the first rack tray when the first rack tray is in the second orientation.

10. The rack volume device coupling system of claim 7, wherein the first rack tray is configured to moveably couple to the rack volume base using a pivotable coupling that is configured to allow the first rack tray to pivot relative to the rack volume base to move from the first orientation and into the second orientation, and using a translational coupling that is configured to allow the first rack tray to translate relative to the rack volume base.

11. A method for coupling a device to a rack, comprising:

providing a rack that defines a plurality of device slots and that includes a rack wall that defines a rack volume adjacent a first device slot of the plurality of device slots;

positioning a rack volume base in the rack volume, wherein the rack volume base defines a rack tray housing;

moving a first rack tray from a first orientation in which the first rack tray is located in the rack tray housing and into a second orientation in which the first rack tray extends from the rack volume and into the first device slot;

receiving and housing a first device in the first rack tray by moving the first device through the first device slot and into the first rack tray when the first rack tray is in the second orientation; and moving the first rack tray from the second orientation and into the first orientation such that the first device is located in the rack volume, wherein the rack wall impedes access to the rack volume by the first device such that the first device must be moved through the first device slot and into the first rack tray to access the rack volume.

12. The method of claim 11, further comprising:

moving a second rack tray, which is located adjacent the first rack tray, from the first orientation in which the second rack tray is located in the rack tray housing and into the second orientation in which the second rack tray extends from the rack volume and into the first device slot;

receiving and housing a second device in the second rack tray by moving the second device through the first device slot and into the second rack tray when the second rack tray is in the second orientation; and moving the second rack tray from the second orientation and into the first orientation such that the second device is located in the rack volume.

13. The method of claim 11, wherein the first rack tray includes a plurality of device engagement features that engage the first device in order to resist movement of the first device relative to the first rack tray when the first rack tray is in the second orientation.

14. The method of claim 11, wherein the rack volume base includes a plurality of device engagement features that engage the first device in order to resist movement of the first device when the first rack tray is in the first orientation.

15. The method of claim 11, wherein the first rack tray is moveably coupled to the rack volume base by a pivotable coupling that allows the first rack tray to pivot relative to the rack volume base to move from the first orientation and into the second orientation, and a translational coupling that allows the first rack tray to translate relative to the rack volume base.

16. The method of claim 11, wherein the first rack tray defines at least one opening that provides access to the first device when the first device is positioned in the first rack tray and the first rack tray is in the first orientation.

* * * * *